US008748773B2

(12) United States Patent
Forbes Jones

(10) Patent No.: US 8,748,773 B2
(45) Date of Patent: Jun. 10, 2014

(54) ION PLASMA ELECTRON EMITTERS FOR A MELTING FURNACE

(75) Inventor: Robin M. Forbes Jones, Charlotte, NC (US)

(73) Assignee: ATI Properties, Inc., Albany, OR (US)

( * ) Notice: Subject to any disclaimer, the term of this patent is extended or adjusted under 35 U.S.C. 154(b) by 1049 days.

(21) Appl. No.: 12/546,785

(22) Filed: Aug. 25, 2009

(65) Prior Publication Data

US 2010/0012629 A1    Jan. 21, 2010

Related U.S. Application Data

(63) Continuation-in-part of application No. 12/055,415, filed on Mar. 26, 2008.

(60) Provisional application No. 60/909,118, filed on Mar. 30, 2007.

(51) Int. Cl.
*H01J 37/077* (2006.01)
*H01J 37/305* (2006.01)
*B22D 11/11* (2006.01)
*C22B 9/04* (2006.01)

(52) U.S. Cl.
USPC ............... 219/121.16; 164/250.1; 164/512

(58) Field of Classification Search
USPC .......... 373/10–17; 219/121.16; 164/506, 512, 164/250.1; 118/620, 723 EB; 250/492.1, 250/492.3, 492.21, 492.23; 75/10.13, 75/10.19, 10.2
See application file for complete search history.

(56) References Cited

U.S. PATENT DOCUMENTS

| | | | |
|---|---|---|---|
| 3,005,246 A | | 10/1961 | Murphy et al. |
| 3,072,982 A | | 1/1963 | Gordon et al. |
| 3,101,515 A | | 8/1963 | Hanks |
| 3,105,275 A | * | 10/1963 | Hanks ............................ 164/506 |
| 3,157,922 A | | 11/1964 | Helmut |
| 3,177,535 A | * | 4/1965 | Hanks ............................ 164/506 |
| 3,288,593 A | | 11/1966 | Smith, Jr. et al. |
| 3,342,250 A | * | 9/1967 | Treppschuh et al. ......... 164/469 |
| 3,343,828 A | | 9/1967 | Hunt |
| 3,389,208 A | | 6/1968 | Roberts et al. |

(Continued)

FOREIGN PATENT DOCUMENTS

| | | |
|---|---|---|
| CA | 2048836 A1 | 4/1992 |
| DE | 3810294 | 10/1988 |

(Continued)

OTHER PUBLICATIONS

Office Action dated May 15, 2012 in U.S. Appl. No. 12/055,415.

(Continued)

*Primary Examiner* — Geoffrey S Evans
(74) *Attorney, Agent, or Firm* — K & L Gates LLP; John E. Grosselin, III

(57) ABSTRACT

An apparatus for melting an electrically conductive metallic material comprises an auxiliary ion plasma electron emitter configured to produce a focused electron field including a cross-sectional profile having a first shape. The apparatus further comprises a steering system configured to direct the focused electron field to impinge the focused electron field on at least a portion of the electrically conductive metallic material to at least one of melt or heat any solidified portions of the electrically conductive metallic material, any solid condensate within the electrically conductive metallic material, and/or regions of a solidifying ingot.

29 Claims, 10 Drawing Sheets

(56) References Cited

U.S. PATENT DOCUMENTS

| | | | |
|---|---|---|---|
| 3,420,977 | A | 1/1969 | Hanks et al. |
| 3,519,059 | A | 7/1970 | Voskoboinikov et al. |
| 3,547,622 | A | 12/1970 | Hutchinson |
| 3,576,207 | A | 4/1971 | Grenfell et al. |
| 3,627,293 | A | 12/1971 | Sperner |
| 3,690,635 | A | 9/1972 | Harker et al. |
| 3,702,630 | A | 11/1972 | Peytavin et al. |
| 3,737,305 | A | 6/1973 | Blayden et al. |
| 3,786,853 | A | 1/1974 | Cooper |
| 3,817,503 | A | 6/1974 | Lafferty et al. |
| 3,825,415 | A | 7/1974 | Johnston et al. |
| 3,826,301 | A | 7/1974 | Brooks |
| 3,868,987 | A | 3/1975 | Galey et al. |
| 3,896,258 | A | 7/1975 | Hanks |
| 3,909,921 | A | 10/1975 | Brooks |
| 3,970,892 | A | 7/1976 | Wakalopulos |
| 3,972,713 | A | 8/1976 | Muzyka et al. |
| 3,985,177 | A | 10/1976 | Buehler |
| 3,988,084 | A | 10/1976 | Esposito et al. |
| 3,989,091 | A | 11/1976 | Medovar et al. |
| 4,025,818 | A | 5/1977 | Giguere et al. |
| 4,058,697 | A | 11/1977 | Sokolov et al. |
| 4,061,944 | A | 12/1977 | Gay |
| 4,062,700 | A | 12/1977 | Hayami et al. |
| 4,066,117 | A | 1/1978 | Clark et al. |
| 4,136,527 | A | 1/1979 | Kading |
| 4,190,404 | A | 2/1980 | Drs et al. |
| 4,221,587 | A | 9/1980 | Ray |
| 4,261,412 | A | 4/1981 | Soykan et al. |
| 4,264,641 | A | 4/1981 | Mahoney et al. |
| 4,272,463 | A | 6/1981 | Clark et al. |
| 4,305,451 | A | 12/1981 | Ksendzyk et al. |
| 4,343,433 | A | 8/1982 | Sickles |
| 4,426,141 | A | 1/1984 | Holcomb |
| 4,441,542 | A | 4/1984 | Pryor et al. |
| 4,449,568 | A | 5/1984 | Narasimham |
| 4,471,831 | A | 9/1984 | Ray |
| 4,482,376 | A | 11/1984 | Tarasescu et al. |
| 4,544,404 | A | 10/1985 | Yolton et al. |
| 4,575,325 | A | 3/1986 | Duerig et al. |
| 4,596,945 | A | 6/1986 | Schumacher et al. |
| 4,619,597 | A | 10/1986 | Miller |
| 4,619,845 | A | 10/1986 | Ayers et al. |
| 4,631,013 | A | 12/1986 | Miller |
| 4,642,522 | A | 2/1987 | Harvey et al. |
| 4,645,978 | A | 2/1987 | Harvey et al. |
| 4,689,074 | A | 8/1987 | Seaman et al. |
| 4,694,222 | A | 9/1987 | Wakalopulos |
| 4,697,631 | A | 10/1987 | Bungeroth et al. |
| 4,730,661 | A | 3/1988 | Stephan |
| 4,738,713 | A | 4/1988 | Stickle |
| 4,755,722 | A | 7/1988 | Wakalopulos |
| 4,762,553 | A | 8/1988 | Savage et al. |
| 4,762,975 | A | 8/1988 | Mahoney et al. |
| 4,769,064 | A | 9/1988 | Buss et al. |
| 4,779,802 | A | 10/1988 | Coombs |
| 4,786,844 | A * | 11/1988 | Farrell et al. ............. 315/111.21 |
| 4,788,016 | A | 11/1988 | Colclough et al. |
| 4,801,411 | A | 1/1989 | Wellinghoff et al. |
| 4,801,412 | A | 1/1989 | Miller |
| 4,838,340 | A | 6/1989 | Entrekin et al. |
| 4,842,170 | A | 6/1989 | Del Vecchio et al. |
| 4,842,704 | A | 6/1989 | Collins et al. |
| 4,910,435 | A | 3/1990 | Wakalopulos |
| 4,916,198 | A | 4/1990 | Scheve et al. |
| 4,916,361 | A | 4/1990 | Schumacher et al. |
| 4,919,335 | A | 4/1990 | Hobson et al. |
| 4,926,923 | A | 5/1990 | Brooks et al. |
| 4,931,091 | A | 6/1990 | Waite et al. |
| 4,932,635 | A | 6/1990 | Harker |
| 4,936,375 | A | 6/1990 | Harker |
| 4,938,275 | A | 7/1990 | Leatham et al. |
| 4,955,045 | A | 9/1990 | Friede et al. |
| 4,961,776 | A | 10/1990 | Harker |
| 5,004,153 | A | 4/1991 | Sawyer |
| 5,074,933 | A | 12/1991 | Ashok et al. |
| 5,084,091 | A | 1/1992 | Yolton |
| 5,100,463 | A * | 3/1992 | Harker ........................ 75/10.13 |
| 5,102,449 | A | 4/1992 | Ducrocq et al. |
| 5,102,620 | A | 4/1992 | Watson et al. |
| 5,104,634 | A | 4/1992 | Calcote |
| 5,142,549 | A | 8/1992 | Bremer |
| 5,160,532 | A | 11/1992 | Benz et al. |
| 5,167,915 | A | 12/1992 | Yamashita et al. |
| 5,176,874 | A | 1/1993 | Mourer et al. |
| 5,222,547 | A | 6/1993 | Harker |
| 5,226,946 | A | 7/1993 | Diehm et al. |
| 5,240,067 | A | 8/1993 | Hatch |
| 5,263,044 | A | 11/1993 | Bremer |
| 5,266,098 | A | 11/1993 | Chun et al. |
| 5,268,018 | A | 12/1993 | Mourer et al. |
| 5,272,718 | A | 12/1993 | Stenzel et al. |
| 5,291,940 | A | 3/1994 | Borofka et al. |
| 5,296,274 | A | 3/1994 | Movchan et al. |
| 5,302,881 | A | 4/1994 | O'Loughlin |
| 5,310,165 | A | 5/1994 | Benz et al. |
| 5,325,906 | A | 7/1994 | Benz et al. |
| 5,332,197 | A | 7/1994 | Benz et al. |
| 5,346,184 | A | 9/1994 | Ghosh |
| 5,348,566 | A | 9/1994 | Sawyer et al. |
| 5,366,206 | A | 11/1994 | Sawyer et al. |
| 5,368,897 | A | 11/1994 | Kurihara et al. |
| 5,377,961 | A | 1/1995 | Smith et al. |
| 5,378,957 | A | 1/1995 | Kelly |
| 5,381,847 | A | 1/1995 | Ashok et al. |
| 5,384,821 | A | 1/1995 | Jedlitschka et al. |
| 5,460,851 | A | 10/1995 | Jenkins |
| 5,472,177 | A | 12/1995 | Benz et al. |
| 5,480,097 | A | 1/1996 | Carter, Jr. et al. |
| 5,489,820 | A | 2/1996 | Ivanov et al. |
| 5,503,655 | A | 4/1996 | Joseph |
| 5,527,381 | A | 6/1996 | Waite et al. |
| 5,649,992 | A | 7/1997 | Carter, Jr. et al. |
| 5,649,993 | A | 7/1997 | Carter, Jr. et al. |
| 5,683,653 | A | 11/1997 | Benz et al. |
| 5,699,850 | A | 12/1997 | Beitelman et al. |
| 5,722,479 | A | 3/1998 | Oeftering |
| 5,749,938 | A | 5/1998 | Coombs |
| 5,749,989 | A | 5/1998 | Linman et al. |
| 5,769,151 | A | 6/1998 | Carter, Jr. et al. |
| 5,809,057 | A | 9/1998 | Benz et al. |
| 5,810,066 | A | 9/1998 | Knudsen et al. |
| 5,841,235 | A * | 11/1998 | Engelko et al. ........... 315/111.21 |
| 5,894,980 | A | 4/1999 | Orme-Marmarelis et al. |
| 5,954,112 | A | 9/1999 | Forbes Jones et al. |
| 5,972,282 | A * | 10/1999 | Aguirre et al. ................. 266/208 |
| 5,985,206 | A | 11/1999 | Zabala et al. |
| 5,992,503 | A | 11/1999 | Knudsen et al. |
| 6,043,451 | A | 3/2000 | Julien et al. |
| 6,068,043 | A | 5/2000 | Clark |
| 6,103,182 | A | 8/2000 | Campbell |
| 6,135,194 | A | 10/2000 | Flinn et al. |
| 6,156,667 | A | 12/2000 | Jewett |
| 6,162,377 | A | 12/2000 | Ghosh et al. |
| 6,168,666 | B1 | 1/2001 | Sun |
| 6,175,585 | B1 * | 1/2001 | Grosse et al. .................... 373/10 |
| 6,264,717 | B1 | 7/2001 | Carter, Jr. et al. |
| 6,350,293 | B1 | 2/2002 | Carter, Jr. et al. |
| 6,407,399 | B1 | 6/2002 | Livesay |
| 6,416,564 | B1 | 7/2002 | Bond |
| 6,427,752 | B1 | 8/2002 | Carter, Jr. et al. |
| 6,460,595 | B1 | 10/2002 | Benz et al. |
| 6,491,737 | B2 | 12/2002 | Orme-Marmerelis et al. |
| 6,496,529 | B1 | 12/2002 | Forbes Jones et al. |
| 6,562,099 | B2 | 5/2003 | Orme-Marmerelis et al. |
| 6,613,266 | B2 | 9/2003 | McDonald |
| 6,631,753 | B1 | 10/2003 | Carter, Jr. et al. |
| 6,772,961 | B2 | 8/2004 | Forbes Jones et al. |
| 6,904,955 | B2 | 6/2005 | Jackson et al. |
| 6,975,073 | B2 | 12/2005 | Wakalopulos |
| 7,033,444 | B1 | 4/2006 | Komino et al. |
| 7,114,548 | B2 | 10/2006 | Forbes Jones et al. |
| 7,150,412 | B2 | 12/2006 | Wang et al. |
| 7,152,432 | B2 | 12/2006 | Wanner et al. |

(56) References Cited

U.S. PATENT DOCUMENTS

| | | |
|---|---|---|
| 7,154,932 B2 | 12/2006 | Forbes Jones et al. |
| 7,337,745 B1 | 3/2008 | Komino et al. |
| 7,374,598 B2 | 5/2008 | Forbes Jones et al. |
| 7,425,716 B2 | 9/2008 | Demos et al. |
| 7,439,188 B2 | 10/2008 | DeOrnellas et al. |
| 7,578,960 B2 | 8/2009 | Forbes Jones et al. |
| 7,798,199 B2 | 9/2010 | Forbes Jones et al. |
| 7,803,211 B2 | 9/2010 | Forbes Jones |
| 7,803,212 B2 | 9/2010 | Forbes Jones et al. |
| 8,156,996 B2 | 4/2012 | Forbes Jones et al. |
| 8,216,339 B2 | 7/2012 | Forbes Jones et al. |
| 2004/0065171 A1 | 4/2004 | Hearley et al. |
| 2005/0173847 A1 | 8/2005 | Blackburn et al. |
| 2007/0062332 A1 | 3/2007 | Forbes Jones et al. |
| 2007/0151695 A1 | 7/2007 | Forbes Jones et al. |
| 2008/0072707 A1 | 3/2008 | Forbes Jones et al. |
| 2008/0115905 A1 | 5/2008 | Forbes Jones et al. |
| 2008/0179033 A1 | 7/2008 | Forbes Jones et al. |
| 2008/0179034 A1 | 7/2008 | Forbes Jones et al. |
| 2008/0223174 A1 | 9/2008 | Forbes Jones et al. |
| 2008/0237200 A1 | 10/2008 | Forbes Jones et al. |
| 2009/0139682 A1 | 6/2009 | Forbes Jones et al. |
| 2010/0258262 A1 | 10/2010 | Forbes Jones et al. |
| 2010/0276112 A1 | 11/2010 | Forbes Jones et al. |
| 2010/0314068 A1 | 12/2010 | Forbes Jones et al. |
| 2012/0168110 A1 | 7/2012 | Forbes Jones et al. |
| 2013/0279533 A1 | 10/2013 | Forbes Jones et al. |

FOREIGN PATENT DOCUMENTS

| | | |
|---|---|---|
| DE | 4011392 B4 | 4/2004 |
| EP | 0073585 A1 | 3/1983 |
| EP | 0095298 A1 | 11/1983 |
| EP | 0225732 B1 | 1/1992 |
| EP | 0486830 A2 | 5/1992 |
| EP | 0518536 A1 | 12/1992 |
| EP | 0400089 B1 | 6/1993 |
| EP | 0428527 B1 | 8/1996 |
| EP | 1101552 A2 | 5/2001 |
| GB | 2203889 A | 10/1988 |
| JP | S63-128134 A | 5/1988 |
| JP | 01-313181 A | 12/1989 |
| JP | 01-313182 A | 12/1989 |
| JP | 3-36205 A | 2/1991 |
| JP | 6-246425 | 9/1994 |
| JP | 8-506382 A | 7/1996 |
| JP | 2001-6572 A | 1/2001 |
| JP | 2001-212662 A | 8/2001 |
| JP | 2001-279340 A | 10/2001 |
| JP | 2001-335854 A | 12/2001 |
| JP | 2002-311877 A | 10/2002 |
| JP | 2004-108696 A | 4/2004 |
| JP | 2006-207838 A | 8/2006 |
| RU | 2089633 C1 | 9/1997 |
| WO | WO 85/05489 A1 | 12/1985 |
| WO | WO 86/00466 A1 | 1/1986 |
| WO | WO 90/01250 A1 | 2/1990 |
| WO | WO 97/49837 A1 | 12/1997 |
| WO | WO 01/096028 A1 | 12/2001 |
| WO | WO 02/40197 A2 | 5/2002 |
| WO | WO 2008/121630 A1 | 10/2008 |

OTHER PUBLICATIONS

Office Action dated May 2, 2011 in U.S. Appl. No. 12/502,558.
Notice of Allowance dated Jun. 22, 2011 in U.S. Appl. No. 12/502,558.
Notice of Allowance dated Feb. 13, 2012 in U.S. Appl. No. 12/502,558.
Corrected Notice of Allowability dated Jun. 12, 2012 in U.S. Appl. No. 12/502,558.
Notice of Allowance dated Feb. 17, 2011 in U.S. Appl. No. 12/861,033.
Office Action dated Jul. 14, 2011 in U.S. Appl. No. 11/978,923.
Office Action dated Oct. 20, 2011 in U.S. Appl. No. 11/978,923.
Office Action dated May 4, 2012 in U.S. Appl. No. 11/978,923.
Office Action dated Aug. 3, 2011 in U.S. Appl. No. 13/108,402.
Notice of Allowance dated Dec. 21, 2011 in U.S. Appl. No. 13/108,402.
U.S. Appl. No. 13/207,629, filed Aug. 11, 2011.
Office Action dated Dec. 14, 2011 in U.S. Appl. No. No. 12/831,669.
Notice of Allowance dated Mar. 9, 2012 in U.S. Appl. No. 12/831,669.
Notice of Allowability dated Jun. 22, 2012 in U.S. Appl. No. 12/831,669.
Office Action dated Jun. 18, 2012 in U.S. Appl. No. 13/420,910.
Notice of Allowance dated Sep. 10, 2012 in U.S. Appl. No. 13/420,910.
Notice of Allowance dated Apr. 12, 2012 in U.S. Appl. No. 12/821,480.
Notice of Allowability dated Jun. 26, 2012 in U.S. Appl. No. 12/821,480.
Office Action dated Jul. 12, 2010 in U.S. Appl. No. 11/841,941.
Notice of Allowance dated Jul. 2, 2010 in U.S. Appl. No. 12/053,238.
Office Action dated Nov. 9, 2010 in U.S. Appl. No. 11/564,021.
Office Action dated Jan. 21, 2011 in U.S. Appl. No. 11/564,021.
Office Action dated Jun. 25, 2010 in U.S. Appl. No. 12/502,558.
Office Action dated Sep. 23, 2010 in U.S. Appl. No. 12/502,558.
Notice of Allowance dated Jan. 3, 2011 in U.S. Appl. No. 12/861,033.
Office Action dated Nov. 10, 2009 in U.S. Appl. No. 11/933,361.
Office Action dated Oct. 1, 2009 in U.S. Appl. No. 11/841,941.
Office Action dated Nov. 27, 2009 in U.S. Appl. No. 12/053,238.
Office Action dated Dec. 9, 2009 in U.S. Appl. No. 12/053,245.
Office Action dated Apr. 27, 2010 in U.S. Appl. No. 11/564,021.
Office Action dated Jun. 3, 2010 in U.S. Appl. No. 12/053,238.
Notice of Allowance dated Jun. 9, 2010 in U.S. Appl. No. 12/053,245.
Notice of Allowance dated Jun. 2, 2010 in U.S. Appl. No. 11/949,808.
Tien et al., "Superalloys, Supercomposites and Superceramics", Academic Press, Inc., Dec. 1989, pp. 49, 76-84.
Ausmus, S.L. and R.A. Beall, "Electroslag Melting of Titanium Slabs", Trans. Internat., Vacuum Metallurgy Conf., Dec. 1967, pp. 675-694.
Chronister et al., "Induction Skull Melting of Titanium and Other Reactive Alloys", Journal of Metals, Sep. 1986, pp. 51-54.
A. J. Cohen, "Anomalous Diffusion in a Plasma Formed from the Exhaust Beam of an Electron-Bombardment Ion Thruster," published Aug. 1968.
Alan Leatham, "Spray Forming: Alloys, Products, and Markets", *JOM-e*, Apr. 1999, vol. 51, No. 4, 13 pages.
B.Q. Li, "Solidification Processing of Materials in Magnetic Fields", JOM-e, Feb. 1998, vol. 50, No. 2, copyright held by *The Minerals, Metals & Materials Society*, 1998, 11 pages.
D.E. Tyler and W.G. Watson, "Nucleated Casting", *Proceedings of the Third International Conference on Spray Forming*, Sep. 1996, 11 pages.
E. M. Oks, et al., "Development of Plasma Cathode Electron Guns," Physics of Plasmas, vol. 6, No. 5, pp. 1649-1654, May 1999.
Kuiken, Gerard, "Thermodynamics of Irreversible Processes: Applications to Diffusion and Rheology", John Wiley & Sons, Oct. 1994, 10 pages.
L. E. Weddle, "Ion Gun Generated Electromagnetic Interference on the Scatha Satellite," published Dec. 1987, 78 pages.
L. M. Smith, et al., "Interferometric Investigation of a Cablegun Plasma Injector," IEEE Transactions on Plasma Science, vol. 28, No. 6, pp. 2272-2275, Dec. 2000.
M. L. Sentis, et al., "Parametric Studies of X-Ray Preionized Discharge XeCl Laser at Single Shot and at High Pulse Rate Frequency (1 kHz)," J. Appl. Phys., vol. 66, No. 5, Sep. 1, 1989, pp. 1925-1930.
Macky, W.A., "Some Investigations on the Deformation and Breaking of Water Drops in Strong Electric Fields", Proc. Roy. Soc. London, Series A, Jul. 2, 1931, pp. 565-587.
P. F. McKay, "Development of a Twelve-Plasma Gun, Single-Pulser Combination for Use in the PBFA-1 Hybrid Ion Diode," published Oct. 1985, 38 pages.
R. C. Olsen, et al., "Plasma Wave Observations During Ion Gun Experiments," Journal of Geophysical Research, vol. 95, No. A6, Jun. 1, 1990, pp. 7759-7771.

(56) References Cited

OTHER PUBLICATIONS

S. Humphries, Jr., et al., "Pulsed Plasma Guns for Intense Ion Beam Injectors," Rev. Sci. Instrum. vol. 52, No. 2, Feb. 1981, pp. 162-171.
Sandia National Labs, "Particle Beam Fusion Progress Report, Jan.-Jun. 1980," published May 1981, 173 pages.
W. Clark, "Electron Gun Technology," Hughes Research Laboratories, Final Report No. N00014-72-C-0496, 92 pages, Dec. 1976.
W. M. Clark, et al., "Ion Plasma Electron Gun Research," Dec. 1977, 43 pages.
W.T. Carter, Jr. et al. "The CMSF Process: The Spray Forming of Clean Metal", *JOM-e*, Apr. 1999, vol. 51, No. 4, 7 pages.
William T. Carter, Jr. and Robin M. Forbes-Jones, "Nucleated Casting for Land-Based Gas Turbines", *Advanced Materials & Processes*, Jul. 2002, pp. 27-29.
William T. Carter, Jr. and Robin M. Forbes-Jones, "Nucleated Casting for the Production of Large Superalloy Ingots", *JOM*, Apr. 2005, pp. 52-57.
Y. Kiwamoto, "Small Barium Rail Gun for Plasma Injection," Rev. Sci. Instrum., vol. 51. No. 3, Mar. 1980, pp. 285-287.
Office Action dated Dec. 21, 2007 in U.S. Appl. No. 11/232,702.
Office Action dated Jul. 18, 2008 in U.S. Appl. No. 11/232,702.
Office Action dated Dec. 12, 2008 in U.S. Appl. No. 11/232,702.
Notice of Allowance dated Apr. 13, 2009 in U.S. Appl. No. 11/232,702.
Office Action dated Mar. 11, 2009 in U.S. Appl. No. 11/933,361.
Office Action dated Feb. 13, 2009 in U.S. Appl. No. 11/841,941.
Office Action dated Jun. 28, 2007 in U.S. Appl. No. 10/913,361.
Office Action dated Sep. 26, 2007 in U.S. Appl. No. 10/913,361.
Notice of Allowance dated Jan. 14, 2008 in U.S. Appl. No. 10/913,361.
Office Action dated Dec. 19, 2002 in U.S. Appl. No. 10/158,382.
Office Action dated Jun. 3, 2003 in U.S. Appl. No. 10/158,382.
Office Action dated Mar. 18, 2004 in U.S. Appl. No. 10/158,382.
Office Action dated Dec. 29, 2004 in U.S. Appl. No. 10/158,382.
Office Action dated Aug. 25, 2005 in U.S. Appl. No. 10/158,382.
Notice of Allowance dated May 2, 2006 in U.S. Appl. No. 10/158,382.
Supplemental Notice of Allowability dated Jun. 12, 2006 in U.S. Appl. No. 10/158,382.
Supplemental Notice of Allowability dated Jun. 29, 2006 in U.S. Appl. No. 10/158,382.
Office Action dated Nov. 20, 2002 in U.S. Appl. No. 09/882,248.
Office Action dated Jan. 21, 2003 in U.S. Appl. No. 09/882,248.
Office Action dated Jul. 8, 2003 in U.S. Appl. No. 09/882,248.
Notice of Allowance dated Oct. 22, 2003 in U.S. Appl. No. 09/882,248.
Office Action dated Dec. 6, 2001 in U.S. Appl. No. 09/726,720.
Notice of Allowance dated Apr. 23, 2002 in U.S. Appl. No. 09/726,720.
Office Action dated Aug. 29, 2005 in U.S. Appl. No. 11/008,048.
Office Action dated Nov. 8, 2005 in U.S. Appl. No. 11/008,048.
Response to Rule 312 Communication dated Aug. 16, 2006 in U.S. Appl. No. 11/008,048.
Notice of Allowance dated Jun. 27, 2006 in U.S. Appl. No. 11/008,048.
Bakish, R., "The Substance of a Technology: Electron-Beam Melting and Refining," JOM, Nov. 1998, pp. 28-30.
ALD Vacuum Technologies: "Electron Beam Melting," http://web.ald-vt.de/cms/vakuum-technologie/anlagen/electron-beam-melting-eb/, Aug. 25, 2009.
"Electron-Beam Melting of Titanium," printed from http://www.antares.com.ua, Internet site, website accessed on Apr. 4, 2007, 6 pages.
Vizir, et al., "Recent Development and Applications of Electron, Ion and Plasma Sources Based on Vacuum Arc and Low Pressure Glow," IEEE Int. Conf. Plasma Sci., Jul. 2004, p. 286.
ALD Vacuum Technologies AG, "Electron Beam Melting (EB), Electron Beam Melting Processes and Furnaces," created May 7, 2003, modified Aug. 25, 2003, accessed Sep. 17, 2008, 6 pages.
Tamura, et al., "A Plasma Ion Gun with Pierce Electrode," Japan J. Appl. Phys. 5, Oct. 1966, pp. 985-987.
Cao, "Solidification and Solid State Phase Transformation of Allvac® 718Plus™ Alloy", Journal of the Minerals, Metals & Materials Society, Oct. 2005, pp. 165-177.
Lavernia, EL. and Y. Wu, "Spray Atomization and Deposition", John Wiley & Sons, Feb. 25, 1996, pp. 311-314.
Sanchez, et al., "Thermal Effect of Ion Implantation with Ultra-Short Ion Beams," Surface and Coatings Technology, vol. 70, Jan. 1995, pp. 181-186.
Wakalopulos, G., "Pulsed WIP Electron Gun. Final Report—Fabrication Phase 1 x 40 cm and 1 x 70 cm Cooled WIP Electron Gun," Dec. 1980, 33 pages.
Semashko, et al. "Sources of Gas-Ion Beams with Current up to 60 A for Controlled Therrnonuclear Fusion and Technological Applications," Atomic Energy, vol. 82, No. 1, Jan. 1997, pp. 21-27.
Hasse, Rolf, "Thermodynamics of irreversible Processes", Dover Publications, Inc., New York, Oct. 1990, 5 pages.
Knyazev et al., "Pulsed Plasma Sources for the Production of Intense Ion Beams Based on "Catalytic" Resonance ionization," Aug. 1994, 23 pages.
Fontaine et al., "Performance Characteristics of a Long Pulse and High Average Power XeCI Discharge Laser," SPIE vol. 801, High Power Lasers, Sep. 1987, pp. 100-105.
Duval et ai., "Theoretical and Experimental Approach of the Volatilization in Vacuum Metallurgy," pp. 83-97: Proceedings of the Conference on Electron Beam Melting and Refining-State of the Art 1997, R. Bakish ed., Bakish Materials Corporation.
Arif, et al., "Waves Behaviour in a High Repetition High Average Power Excimer Laser," SPIE vol. 1031 GCL—Seventh International Symposium on Gas Flow and Chemical Lasers, Aug. 1988, pp. 392-399.
Bertram et al., "Quantitative Simulations of a Superalloy VAR Ingot at the Macroscale", *Proceedings of the 1997 international Symposium on Liquid Metal Processing and Casting*, A. Mitchell and P. Auburtin, eds.. Am. Vac. Soc., Feb. 1997, pp. 110-132.
Office Action dated May 29, 2013 in U.S. Appl. No. 11/564,021.
Notice of Allowance dated Jun. 11, 2013 in U.S. Appl. No. 12/055,415.
Office Action dated May 24, 2013 in U.S. Appl. No. 13/207,629, filed.
Bhatia, A., "Thermal Spraying Technology and Applications", Continuing Education and Development, Inc. Jan. 29, 1999, 91 pages.
U.S. Appl. No. 13/919,233, filed Jun. 17, 2013.
Office Action dated Dec. 20, 2012 in U.S. Appl. No. 12/055,415.
Cobine, James Dillon, "Gaseous Conductors: Theory and Engineering Applications", Dover Publications, Inc. New York, 1958, 6 pages.
S. Suckewer, "Spectral Measurements of Plasma Temperature in the Rod Plasma Injector (RPI)," Nukleonika, No. 1, 1970, 22 pages.
Sears, Francis Weston, An Introduction to Thermodynamics, The Kinetic Theory of Gases, and Statistical Mechanics, 2nd Edition, Addison-Wesley, 1953, pp. 335-337.
V. A. Chernov, "The Powerful High-Voltage Glow Discharge Electron Gun and Power Unit on Its Base," 1994 Intern. Conf. on Electron Beam Melting (Reno, Nevada), pp. 259-267.
V. M. Chicherov, "Density Distribution of Hydrogen in the Interior of a Coaxial Plasma Injector Prior to the Application of High Voltage to its Electrodes," Journal of Technical Physics, vol. 36, No. 6, pp. 1055-1057, 1966.
Notice of Allowance dated Oct. 8, 2013 in U.S. Appl. No. 12/055,415.
Office Action dated Oct. 16, 2013 in U.S. Appl. No. 11/564,021.

\* cited by examiner

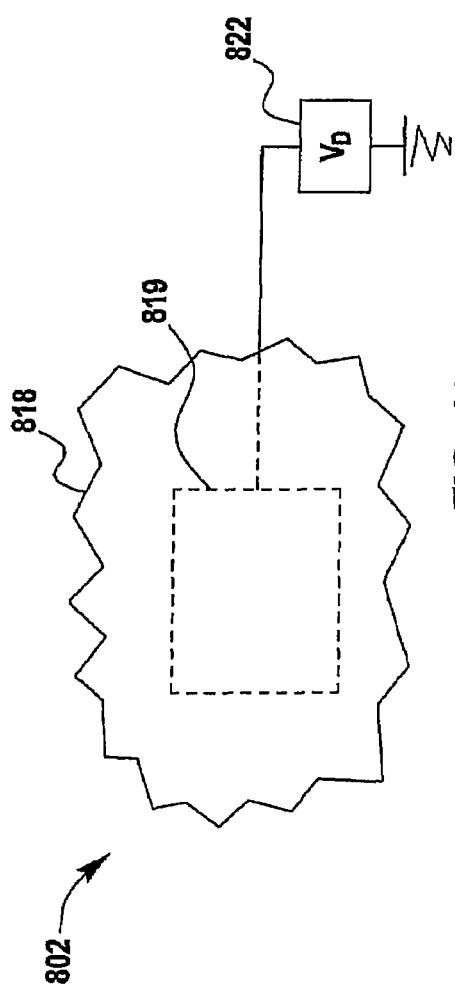
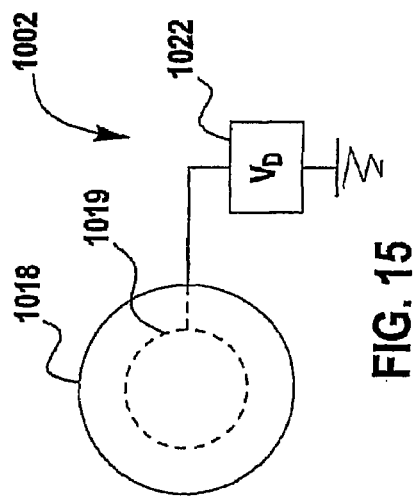
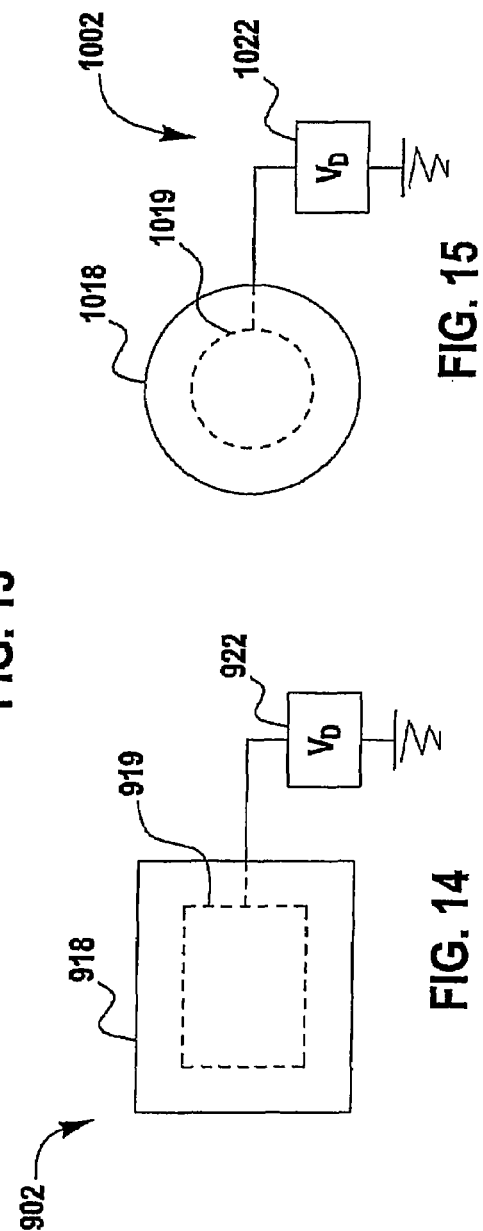
FIG. 13
FIG. 15
FIG. 14

ION PLASMA ELECTRON EMITTERS FOR A MELTING FURNACE

CROSS-REFERENCE TO RELATED APPLICATIONS

The present application claims priority under 35 U.S.C. §120 to, and is a continuation-in-part of, U.S. patent application Ser. No. 12/055,415, filed Mar. 26, 2008, now pending, which claims priority under 35 U.S.C. §119(e) to U.S. Provisional Patent Application Ser. No. 60/909,118, filed Mar. 30, 2007. Both of the referenced previously-filed applications are incorporated by reference herein in their entireties.

BACKGROUND OF THE TECHNOLOGY

1. Field of Technology

The present disclosure relates to equipment and techniques for melting metals and metallic alloys (hereinafter "alloys"). The present disclosure more specifically relates to equipment and techniques utilizing electrons to melt or heat alloys and/or condensate formed within the melted alloys.

2. Description of the Background of the Technology

An alloy melting process involves preparing a charge of suitable materials and then melting the charge. The molten charge or "melt" may then be refined and/or treated to modify melt chemistry, remove undesirable components from the melt, and/or affect the microstructure of articles cast from the melt. Melting furnaces are powered either by electricity or by the combustion of fossil fuels, and selection of a suitable apparatus is largely influenced by the relative costs and applicable environmental regulations, as well as by the identity of the material being prepared. A variety of melting techniques and apparatus are available today. General classes of melting techniques include, for example, induction melting (including vacuum induction melting), arc melting (including vacuum arc skull melting), crucible melting, and electron beam melting.

Electron beam melting typically involves utilizing thermo-ionic electron beam guns to generate high energy substantially linear streams of electrons which are used to heat the target materials. Thermo-ionic electron beam guns operate by passing current to a filament, thereby heating the filament to high temperature and "boiling" electrons away from the filament. The electrons generated from the filament are then focused and accelerated toward the target in the form of a very narrow, substantially linear electron beam. A type of ion plasma electron beam gun also has been used for preparing alloy melts. Specifically, a "glow discharge" electron beam gun described in V. A. Chernov, "Powerful High-Voltage Glow Discharge Electron Gun and Power Unit on Its Base", 1994 Intern. Conf. on Electron Beam Melting (Reno, Nev.), pp. 259-267, has been incorporated in certain melting furnaces available from Antares, Kiev, Ukraine. Such devices operate by producing a cold plasma including cations which bombard a cathode and produce electrons that are focused to form a substantially linear electron beam.

The substantially linear electron beams produced by the foregoing types of electron beam guns are directed into the evacuated melting chamber of an electron beam melting furnace and impinged on the materials to be melted and/or maintained in a molten state. The conduction of electrons through the electrically conductive materials quickly heats them to a temperature in excess of the particular melting temperature. Given the high energy of the substantially linear electron beams, which may be, for example, about 100 kW/cm$^2$, linear electron beam guns are very high temperature heat sources and are readily able to exceed the melting and, in some cases, the vaporization temperatures of the materials on which the substantially linear beams impinge. Using magnetic deflection or similar directional means, the substantially linear electron beams are rastered at high frequency across the target materials within the melting chamber, allowing the beam to be directed across a wide area and across targets having multiple and complex shapes.

Because electron beam melting is a surface heating method, it typically produces only a shallow molten pool, which may be advantageous in terms of limiting porosity and segregation in the cast ingot. Because the superheated metal pool produced by the electron beam is disposed within the high vacuum environment of the furnace melting chamber, the technique also beneficially tends to degas the molten material. Also, undesirable metallic and non-metallic constituents within the alloy having relatively high vapor pressures may be selectively evaporated in the melting chamber, thereby improving alloy purity. On the other hand, one must account for the evaporation of desirable constituents produced by the highly-focused substantially linear electron beam. Undesirable evaporation must be factored into production and may significantly complicate alloy production when using electron beam melting furnaces.

Various melting and refining methods involve the electron beam melting of feed stocks using thermo-ionic electron guns. Drip melting is a classic method used in thermo-ionic electron beam gun melting furnaces for processing refractory metals such as, for example, tantalum and niobium. Raw material in the form of a bar is typically fed into the furnace chamber and a linear electron beam focused on the bar drip-melts the material directly into a static or withdrawal mold. When casting in a withdrawal mold, the liquid pool level is maintained on the top of the growing ingot by withdrawing the ingot bottom. The feed material is refined as a result of the degassing and selective evaporation phenomena described above.

The electron beam cold hearth melting technique is commonly used in the processing and recycling of reactive metals and alloys. The feedstock is drip melted by impinging a substantially linear electron beam on an end of a feedstock bar. The melted feedstock drips into an end region of a water-cooled copper hearth, forming a protective skull. As the molten material collects in the hearth, it overflows and falls by gravity into a withdrawal mold or other casting device. During the molten material's dwell time within the hearth, substantially linear electron beams are quickly rastered across the surface of the material, retaining it in a molten form. This also has the effects of degassing and refining the molten material through evaporation of high vapor pressure components. The hearth also may be sized to promote gravity separation between high-density and low-density solid inclusions, in which case oxide and other relatively low-density inclusions remain in the molten metal for a time sufficient to allow dissolution while high density particles sink to the bottom and become trapped in the skull.

Given the various benefits of conventional electron beam melting techniques, it would be advantageous to further improve this technology.

SUMMARY

According to one non-limiting aspect of the present disclosure, an apparatus for melting an electrically conductive metallic material is described. The apparatus comprises a vacuum chamber, a hearth disposed in the vacuum chamber, and at least one ion plasma electron emitter disposed in or adjacent the vacuum chamber and positioned to direct a first field of electrons having a first cross-sectional area into the vacuum chamber. The first field of electrons has sufficient energy to heat the electrically conductive metallic material to its melting temperature. The apparatus further comprises at least one of a mold and an atomizing apparatus positioned to receive the electrically conductive metallic material from the hearth, and an auxiliary ion plasma electron emitter disposed in or adjacent the vacuum chamber and positioned to direct a second field of electrons having a second cross-sectional area into the vacuum chamber. The second field of electrons has sufficient energy to at least one of heat portions of the electrically conductive metallic material to at least its melting temperature, melt any solid condensate within the electrically conductive metallic material, and provide heat to regions of a forming ingot. The first cross-sectional area of the first field of electrons is different than the second cross-sectional area of the second field of electrons. The second field of electrons emitted by the auxiliary ion plasma electron emitter is steerable.

According to another non-limiting aspect of the present disclosure, an apparatus for melting an electrically conductive metallic material is described. The apparatus comprises a vacuum chamber, a hearth disposed in the vacuum chamber, and a melting device configured to melt the electrically conductive metallic material. The apparatus further comprises at least one of a mold and an atomizing apparatus positioned to receive molten electrically conductive metallic material from the hearth, and an auxiliary ion plasma electron emitter disposed in or adjacent to the vacuum chamber and positioned to direct a focused electron field having a cross-sectional area into the vacuum chamber. The focused field of electrons has sufficient energy to at least one of melt portions of the electrically conductive metallic material, melt solid condensate within the electrically conductive metallic material, and heat regions of a solidifying ingot. The focused field of electrons is steerable to direct the focused electron field toward at least one of the portions of the electrically conductive metallic material, the solid condensate, and the solidifying ingot.

According to yet another non-limiting aspect of the present disclosure, an apparatus for melting an electrically conductive metallic material is described. The apparatus comprises an auxiliary ion plasma electron emitter configured to produce a focused electron field including a cross-sectional profile having a first shape. The apparatus further comprises a steering system configured to direct the focused electron field to impinge the focused electron field on at least a portion of the electrically conductive metallic material to at least one of melt any solidified portions of the electrically conductive metallic material, melt any solid condensate within the electrically conductive metallic material, and provide heat to regions of a forming ingot.

According to still a further aspect of the present disclosure, a method of processing a material is provided. The method comprises introducing a material comprising at least one of a metal and a metallic alloy into a furnace chamber maintained at a low pressure relative to atmospheric pressure, and generating a first electron field having a first cross-sectional area using at least a first ion plasma electron emitter. The method further comprises subjecting the material within the furnace chamber to the first electron field to heat the material to a temperature above a melting temperature of the material, and generating a second electron field having a second cross-sectional area using a second ion plasma electron emitter. The method further comprises subjecting at least one of any solid condensate within the material, any solidified portions of the material, and regions of a solidifying ingot to the second electron field, using a steering system, to melt or heat at least one of the solid condensate, the solidified portions, and the regions of the solidifying ingot. The first cross-sectional area of the first electron field is different than the second cross-sectional area of the second electron field.

According to a further aspect of the present disclosure, a method of processing a material is provided. The method comprises introducing a material comprising at least one of a metal and a metallic alloy into a furnace chamber maintained at a low pressure relative to atmospheric pressure, and subjecting the material within the furnace chamber to a melting device configured to heat the material to a temperature above a melting temperature of the material. The method further comprises generating a focused electron field using an auxiliary ion plasma electron emitter, and subjecting at least one of any solid condensate within the material, any solidified portions of the material, and regions of a solidifying ingot to the focused electron field, using a steering system, to melt or heat at least one of the solid condensate, the solidified portions, and the regions of the solidifying ingot.

According to yet a further aspect of the present disclosure, a method of processing a material is provided. The method comprises generating a focused electron field including a cross-sectional profile having a first shape using an auxiliary ion plasma electron emitter, and steering the focused electron field to impinge the focused electron field on the material and melt or heat at least one of any solid condensate within the material, any solidified portions of the material, and regions of a solidifying ingot.

According to still a further aspect of the present disclosure, a method of generating an electron field to melt an electrically conductive material within a melting furnace is provided. The method comprises providing an anode having a first non-linear shape, applying a voltage to the anode, and producing a plasma containing positive cations at the anode. The method further comprises providing a cathode having a second shape, positioning the cathode relative to the anode, and applying a voltage to the cathode. The voltage is configured to negatively charge the cathode. The method further comprises accelerating the positive cations toward the cathode to generate free secondary electrons, and forming the electron field using the free secondary electrons. The electron field has a cross-sectional profile with a third shape. The third shape corresponds to the first non-linear shape of the anode.

BRIEF DESCRIPTION OF THE DRAWINGS

Features and advantages of the apparatus and methods described herein may be better understood by reference to the accompanying drawings in which:

FIG. 13 is a schematic illustration from a top view of one non-limiting embodiment of an auxiliary ion plasma electron emitter according to the present disclosure;

FIG. 14 is another schematic illustration from a top view of one non-limiting embodiment of an auxiliary ion plasma electron emitter according to the present disclosure; and FIG. 15 is still another schematic illustration from a top view of one non-limiting embodiment of an auxiliary ion plasma electron emitter according to the present disclosure.

The reader will appreciate the foregoing details, as well as others, upon considering the following detailed description of certain non-limiting embodiments of apparatuses and methods according to the present disclosure. The reader also may comprehend certain of such additional details upon carrying out or using the apparatuses and methods described herein.

DETAILED DESCRIPTION OF CERTAIN NON-LIMITING EMBODIMENTS

In the present description of non-limiting embodiments, other than in the operating examples or where otherwise indicated, all numbers expressing quantities or characteristics of ingredients and products, processing conditions, and the like are to be understood as being modified in all instances by the term "about". Accordingly, unless indicated to the contrary, any numerical parameters set forth in the following description are approximations that may vary depending upon the desired properties one seeks to obtain in the apparatus and methods according to the present disclosure. At the very least, and not as an attempt to limit the application of the doctrine of equivalents to the scope of the claims, each numerical parameter should at least be construed in light of the number of reported significant digits and by applying ordinary rounding techniques.

Any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference. Any material, or portion thereof, that is said to be incorporated by reference herein, but which conflicts with existing definitions, statements, or other disclosure material set forth herein is only incorporated to the extent that no conflict arises between that incorporated material and the existing disclosure material.

Figure 1:
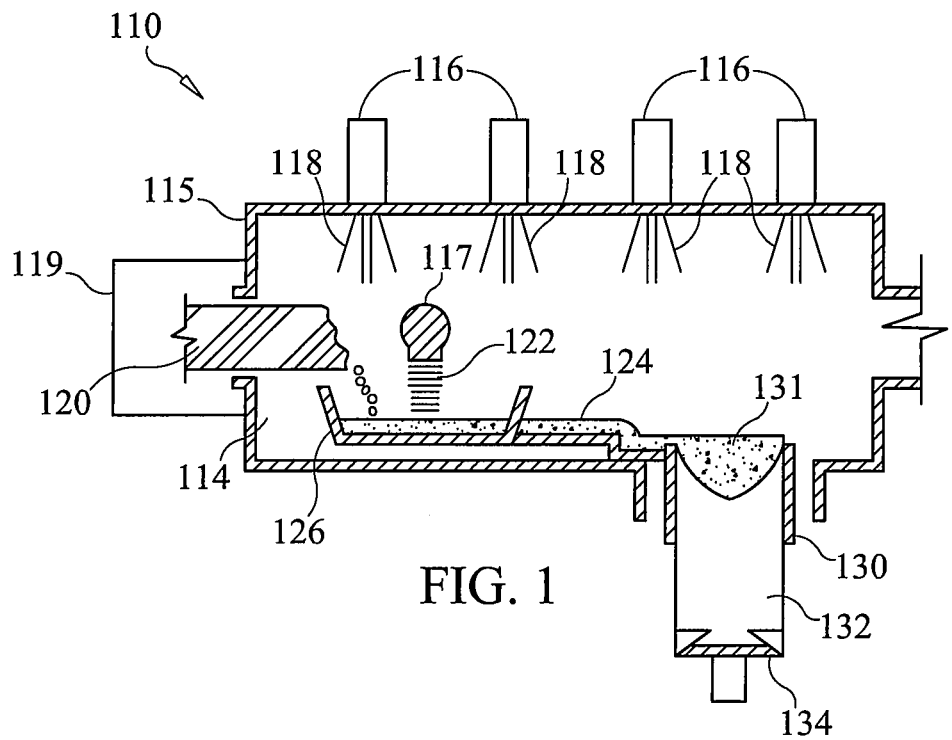
FIG. 1 is a schematic illustration in cross-section of an embodiment of a conventional thermo-ionic electron beam gun melting furnace.

The present disclosure, in part, is directed to an improved design for an electron beam furnace for melting metals and metallic alloys and/or for maintaining the materials in a molten state for use in preparing metallic castings or powders. A conventional thermo-ionic electron beam gun melting furnace is schematically illustrated in FIG. 1. Furnace 110 includes vacuum chamber 114 surrounded by chamber wall 115. Multiple thermo-ionic electron beam guns 116 are positioned outside and adjacent chamber 114 and direct discrete linear electron beams 118 into chamber 114. Feed material in the forms of metallic bar 120 and alloying powder 122 are introduced into chamber 114 by a conventional bar feeder 119 and a conventional particle or granule feeder 117, respectively. The linear electron beam 118 of one of the electron beam guns 116 impinges on and melts an end of bar 120, and the resulting molten alloy 124 falls into water-cooled copper refining hearth 126 (a "cold hearth") within chamber 114. The thermo-ionic electron beam guns 116 are of a conventional design and generate electrons by heating a suitable filament material. The guns 116 focus the generated electrons to a point, and the electrons are projected from the guns 116 in the form of a tightly focused, substantially linear beam. Thus, the electrons projected from the guns 116 essentially impinge on the target as a point source. The heating of the target by the point source of electrons is facilitated by rastering the linear electron beams 118 across at least a portion of the targets, similar to the manner of rastering electrons across the phosphor screen of a cathode ray television tube. Rastering the substantially linear electron beam 118 of a thermo-ionic electron beam gun 116 across the end region of bar 120, for example, melts the bar 120.

With further reference to FIG. 1, the molten alloy 124 deposited in hearth 126 is maintained in a molten state by rastering certain of the substantially linear electron beams 118 across the surface of the molten alloy 124 in a predetermined and programmed pattern. Powdered or granulated alloying materials 122 introduced into the molten alloy 124 by feeder 117 are incorporated into the molten material. Molten alloy 124 advances across the hearth 126 and drops from the hearth by gravity into a copper withdrawal mold 130. Withdrawal mold 130 includes a translatable base 134 so as to accommodate the length of the growing ingot 132. Molten alloy 124 initially collects in withdrawal mold 130 as molten pool 131, and progressively solidifies into ingot 132. Impingement of electrons onto molten pool 131 by means of rastering one or more of the substantially linear electron beams 118 across the pool's surface advantageously maintains regions of the pool 131, particularly at the pool edges, in a molten state.

In furnaces utilizing one or more substantially linear electron beams to heat material in the furnace chamber, such as a conventional thermo-ionic electron beam gun melting furnace, alloys including volatile elements, i.e., elements with relatively high vapor pressure at the furnace melting temperatures, tend to boil off from the molten pool and condense on the relatively cold walls of the furnace chamber. (Common alloying elements having relatively high vapor pressures at temperatures commonly achieved by electron beam melting include, for example, aluminum and chromium.) The substantially linear electron beam melting technique is particularly conducive to volatilization, which is a significant disadvantage of conventional electron beam furnaces when alloying, as opposed to refining or purifying, for at least two reasons. First, the overall and localized chemical composition of the alloy becomes difficult to control during melting due to unavoidable losses of highly volatile elements from the molten pool. Second, the condensate of the vaporized elements tends to build up on the furnace walls over time and may drop back into the melt, thereby contaminating the melt with inclusions and producing localized variations in melt chemistry.

Without intending to be bound by any particular theory, the inventors believe that the foregoing disadvantages of conventional electron beam melting furnaces result from the action of conventional substantially linear electron beams on the materials processed within electron beam furnaces. As suggested above in connection with the description of FIG. 1, conventional electron beam cold hearth melting technology utilizes substantially linear electron beams to both melt the raw materials introduced into the furnace and to maintain the temperature of the molten material as it flows along and over the cold hearth, and into the casting mold. Such furnaces typically include multiple electron beam sources, wherein each source produces a substantially linear electron beam that is essentially a point source. These "points" of intense electron concentration must be rastered rapidly over the areas to be heated so that the average temperature needed to melt the material and allow the molten material to adequately flow is reached throughout the target area. Because of the point source nature of the linear electron beams, however, the spot at which the electron beam impinges on the alloy is heated to an extremely high temperature. This phenomenon of localized intense heating can be observed as visible white radiation emitted from the particular spot at which the electron beam impinges on the solid or molten alloy within the furnace. It is believed that the intense superheating effect that occurs at these spots, along with the high vacuum maintained in the furnace chamber, readily evaporates the relatively volatile elements within the alloy, resulting in the excessive evaporation of the volatile elements and concomitant condensation on the chamber walls. As noted above, such condensation risks contamination of the bath as the condensed material drops back into the molten alloy, and this can result in, for example, marked compositional heterogeneities in the cast ingots.

An improved design for an electron beam melting furnace described herein utilizes one or more ion plasma electron emitters, such as wire-discharge ion plasma electron emitters, for example, as at least a part of the electron source in such a furnace. While wire-discharge ion plasma electron emitters are disclosed herein as exemplary ion plasma electron emitters, it will be understood that the other suitable ion plasma electron emitters (e.g., non-wire-discharge ion plasma electron emitters) can be used with the present disclosure, as discussed in further detail below. As used herein, the terms "ion plasma electron emitter" and "wire-discharge ion plasma electron emitter" refer to an apparatus that produces a relatively wide, non-linear field of electrons by impinging positively charged ions onto a cathode and thereby releasing a field of secondary electrons from the cathode. The electron beam produced by an ion plasma electron emitter is not a linear beam, but instead is a three-dimensional field or "flood" of electrons that, when impinged on the target, covers a two-dimensional region that is very large relative to the small point covered by impinging a substantially linear electron beam onto the target. As such, the electron field produced by ion the plasma electron emitters is referred to herein as a "wide-area" electron field, with reference to the relatively much smaller point of contact produced by conventional electron guns used in electron beam melting furnaces. Wire-discharge ion plasma electron emitters are known in the art (for use in unrelated applications) and are variously referred to as, for example, "wire ion plasma (WIP) electron" guns or emitters, "WIP electron" guns or emitters and, somewhat confusingly, as "linear electron beam emitters" (referring to the linear nature of the plasma-producing wire electrode(s) within certain embodiments of the devices).

Figure 2:
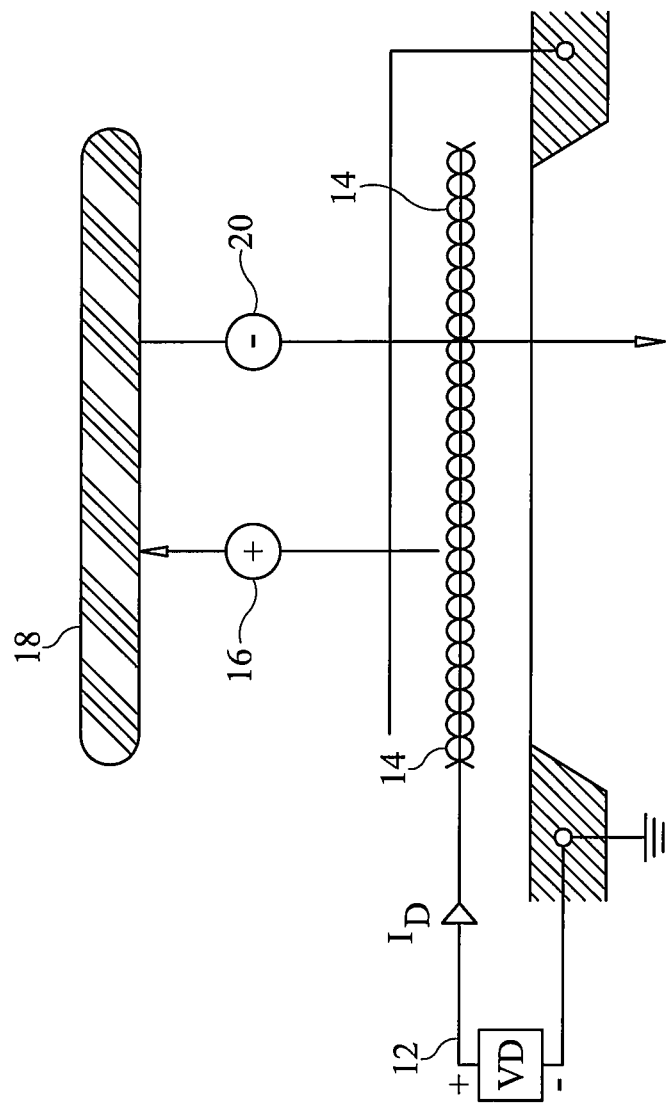
FIG. 2 is a simplified depiction of certain components of an embodiment of a wire-discharge ion plasma electron emitter.

Wire-discharge ion plasma electron emitters are available in a variety of designs, but all such emitters share certain fundamental design attributes. Each such emitter includes a plasma or ionization region including a positive ion source in the form of an elongate wire anode to produce plasma including cations, and a cathode that is spaced from and positioned to intercept positive ions generated by the wire. A large negative voltage is applied to the cathode, causing a fraction of the positive ions in the plasma generated by the wire positive ion source to be accelerated toward and to collide with the cathode surface such that secondary electrons are emitted from the cathode (the "primary" electrons being present within the plasma along with the positive ions). The secondary electrons produced from the cathode surface form a non-linear electron field that typically has the three-dimensional shape of the positive ion plasma impacting the cathode. The secondary electrons are then accelerated from the vicinity of the cathode back toward the anode, experiencing few collisions in the process of passing through the low-pressure gas within the emitter. By properly designing and arranging the various components of the wire-discharge ion plasma electron emitter, a wide field of energetic secondary electrons can be formed at the cathode and accelerated from the emitter and toward the target. FIG. 2 is a simplified depiction of components of a wire-discharge plasma ion electron emitter, wherein a current is applied to a thin wire anode 12 to generate plasma 14. Positive ions 16 within plasma 14 accelerate toward and collide with negatively-charged cathode 18, liberating wide-area secondary electron cloud 20, which is accelerated in the direction of anode 12 by action of the electric field between the electrodes and toward the target.

According to one non-limiting embodiment according to the present disclosure, an apparatus for melting an electrically conductive metallic material in the form of an electron beam melting furnace includes a vacuum chamber (melting chamber) and a hearth disposed in the vacuum chamber and adapted to hold a molten material. At least one wire-discharge ion plasma electron emitter is disposed in or adjacent to the vacuum chamber and is positioned to direct a non-linear, wide-area field of electrons generated by the emitter into the chamber. The wire-discharge ion plasma electron emitter produces a non-linear field of electrons having sufficient energy to heat the electrically conductive metallic material to its melting temperature. A mold or other casting or atomizing device is disposed in communication with the chamber and is positioned and adapted to receive material from the hearth. The furnace may be used to melt any material that may be melted using a conventional electron beam melting furnace, such as, for example, titanium, titanium alloys, tungsten, niobium, tantalum, platinum, palladium, zirconium, iridium, nickel, nickel base alloys, iron, iron base alloys, cobalt, and cobalt base alloys.

Embodiments of an electron beam melting furnace according to the present disclosure may include one or more material feeders adapted to introduce electrically conductive materials or other alloying additives into the vacuum chamber. Preferably, the feeders introduce the materials into the vacuum chamber in a position over or above at least a region of the hearth so that gravity will allow the materials, in solid or molten form, to fall downward and into the hearth. Feeder types may include, for example, bar feeders and wire feeders, and the feeder type selected will depend upon the particular design requirements for the furnace. In certain embodiments of the furnace according to the present disclosure, the material feeder and at least one of the one or more wire-discharge ion plasma electron emitters of the furnace are disposed so that the electron field emitted by the wire-discharge ion plasma electron emitter at least partially impinges on the material introduced into the chamber by the feeder. If the material that is introduced into the vacuum chamber by the feeder is electrically conductive, then the electron field, if of sufficient strength, will heat and melt the material.

The hearth incorporated in embodiments of a melting furnace according to the present disclosure may be selected from the various hearth types known in the art. For example, the furnace may be in the nature of an electron beam cold hearth melting furnace by incorporating a cold hearth or, more specifically, for example, a water-cooled copper cold hearth in the vacuum chamber. As is known to those of ordinary skill, a cold hearth includes cooling means causing molten material within the hearth to freeze to the hearth surface and form a protective layer thereon. As another example, the hearth may be an "autogenous" hearth, which is a hearth that is plated with or fabricated from the alloy that is being melted in the furnace, in which case the bottom surface of the hearth also may be water-cooled to prevent burn-through.

The particular hearth included in the vacuum chamber may include a molten material holding region, in which the molten material resides for a certain dwell time before passing to the casting or atomizing device fluidly connected to the vacuum chamber. In certain embodiments of a furnace according to the present disclosure, the hearth and at least one of the furnace's one or more wire-discharge ion plasma electron emitters are disposed so that the electron field emitted by the wire-discharge ion plasma electron emitter at least partially impinges on the molten material holding region. In this way, the electron field may be applied to maintain the material within the molten material holding region in a molten state, and the heating action of the electron field may also serve to degas and refine the molten material.

Certain non-limiting embodiments of a furnace according to the present disclosure include a mold for casting the molten material. The mold may be any suitable mold known in the art such as, for example, a static mold, a withdrawal mold, or a continuous casting mold. Alternatively, the furnace may include or be associated with an atomization apparatus for producing, for example, a powdered material from the molten material.

One particular non-limiting embodiment of an electron beam melting furnace according to the present disclosure includes a vacuum chamber and a hearth disposed in the vacuum chamber, wherein the hearth includes a molten material holding region. The furnace further includes one or more wire-discharge ion plasma electron emitters disposed in or adjacent the vacuum chamber. The hearth and the at least one wire-discharge ion plasma electron emitter are disposed so that an electron field produced by the emitter at least partially impinges on the molten material holding region. A withdrawal mold communicates with the vacuum chamber and is positioned to receive molten material from the hearth. A least one feeder is included in the furnace and is adapted to introduce material into the vacuum chamber in a position over at least a region of the hearth.

Any suitable wire-discharge ion plasma electron emitter may be used in connection with apparatus according to the present disclosure. Suitable embodiments of wire-discharge ion plasma electron emitters are disclosed in, for example, U.S. Pat. Nos. 4,025,818; 4,642,522; 4,694,222; 4,755,722; and 4,786,844, the entire disclosures of which are hereby incorporated herein by reference. Suitable emitters include those capable of producing a non-linear, wide-area electron field that may be directed into the vacuum chamber of the furnace and that will heat electrically conductive feed materials placed into the furnace chamber to the desired temperature.

In one embodiment of a wire-discharge ion plasma electron emitter, the emitter includes a plasma region and a cathode region. The plasma region includes at least one elongate wire anode adapted to produce plasma including positive ions. The cathode region includes a cathode which is electrically connected to a high voltage power supply adapted to negatively charge the cathode. In the wire-discharge ion plasma electron emitter, the electrode used to produce the plasma may be one wire or multiple wires positioned along a length of the plasma region. At least a portion of the cathode impacted by the positive ions is composed of a material suitable for generating electrons. Certain non-limiting embodiments of the cathode disposed in the cathode region of the emitter also may include an insert, such as, for example, a molybdenum insert, having a high melting temperature and a low work function so as to facilitate generation of electrons. The cathode and the anode are positioned relative to one another so that the positive ions in the plasma generated by the wire anode accelerate toward and impinge on the cathode under influence of the electric field between the electrodes, liberating the wide-area field of secondary electrons from the cathode.

Certain non-limiting embodiments of the wire-discharge ion plasma electron emitter include at least one suitably electron transmissive window, such as a thin electron transmissive titanium or aluminum foil, that opens through a wall of the furnace vacuum chamber. Alternative materials from which the electron transmissive window may be constructed include, for example, BN, diamond, and certain other materials composed of low atomic number elements. As discussed herein, other embodiments of the wire-discharge ion plasma electron emitter do not include an electron transmissive window, in which case the plasma region of the emitter fluidly communicates with the vacuum chamber holding the molten material. In either case, the wide-area electron field derived enters the furnace chamber and may be impinged on the material within the chamber. If an electron transmissive window does separate the interior of the electron emitter from the vacuum chamber (as discussed further herein), then the electron field passes through the window as it is projected from the electron emitter into the vacuum chamber. In certain non-limiting embodiments of a wire-discharge ion plasma electron emitter, the high voltage power supply electrically coupled to the cathode powers the cathode to a negative voltage greater than 20,000 volts. The negative voltage serves the functions of accelerating the positive ions in the plasma toward the cathode and then repelling the secondary electron field from the cathode and toward the anode.

An electron transmissive window is necessary if the pressure within the wire-discharge ion plasma electron emitter differs significantly from the pressure within the furnace chamber, in which case the foil window serves to isolate the two adjacent regions of differing pressure. An advantage of wire-discharge ion plasma electron emitters relative to non-gas containing electron emitters, such as thermo-ionic electron beam guns, is that wire-discharge ion plasma electron emitters must include gas within the plasma region to serve as the plasma source. Although wire-discharge ion plasma electron emitters can operate at very low gas pressures, such devices also can operate effectively at relatively high gas pressures. In contrast, conventional electron beam melting furnaces commonly operate at ultra low vacuum conditions, and in that case an electron transmissive window would be necessary to separate the gas atmosphere within the wire-discharge ion plasma electron emitter and the near vacuum environment within the furnace chamber. It appears, however, that volatile element evaporation within the furnace chamber may be reduced by increasing the gas pressure within the furnace chamber beyond the ultra-low levels of conventional linear (thermo-ionic emitter) electron beam melting furnaces. Those conventional pressures levels are typically within the range of $10^{-3}$ to $7.5\mu$ ($10^{-3}$ to 1 Pa) and do not exceed $15\mu$ (2 Pa). Increasing pressure within the furnace chamber beyond conventional levels, i.e., to pressures exceeding $40\mu$ (5.3 Pa), or more preferably exceeding $300\mu$ (40 Pa), increases the pressure at the surface of the molten material within the furnace and thereby reduces the driving force for undesirable vaporization. For example, data presented in H. Duval et al., "Theoretical and Experimental Approach of the Volatilization in Vacuum Metallurgy", suggests that there is a significant reduction in chromium vapor transport at 66.7 Pa (500 mTorr) argon relative to 4.27 Pa (35 mTorr) argon. Because wire-discharge plasma ion electron emitters already require a partial gas pressure environment (typically of helium) to be operational, the present inventors consider it possible that both the wire-discharge plasma ion electron emitter and the furnace chamber could be operated at substantially the same pressure, wherein the pressure is sufficiently high to allow the electron emitter to operate and also is higher than in conventional electron beam furnaces, thereby reducing undesirable volatilization within the furnace chamber. In such case, the electron transmissive window may be omitted such that the gas environment within the emitter and the furnace chamber is substantially the same. Alternatively, in another embodiment of a wire-discharge ion plasma electron emitter the electrons generated by the emitter pass through a gas-impermeable window that is transparent to electrons, wherein the pressure of ionizable gas within the emitter is suitable for electron emitter operation and the furnace chamber is operated at a pressure greater than conventional pressures in electron beam furnaces and is suitable for minimizing or reducing undesirable volatilization. It will be understood that the reduction in undesirable elemental vaporization would be optimized by both utilizing one or more wire-discharge ion plasma electron emitters, which do not create points of intense heating, along with furnace chamber pressures greater than is conventional in electron beam furnaces.

Further discussion of possible embodiments of an electron beam melting furnace and possible embodiments of a wire-discharge ion plasma electron emitter useful in connection with a furnace according to the present disclosure are provided below.

Figure 3:
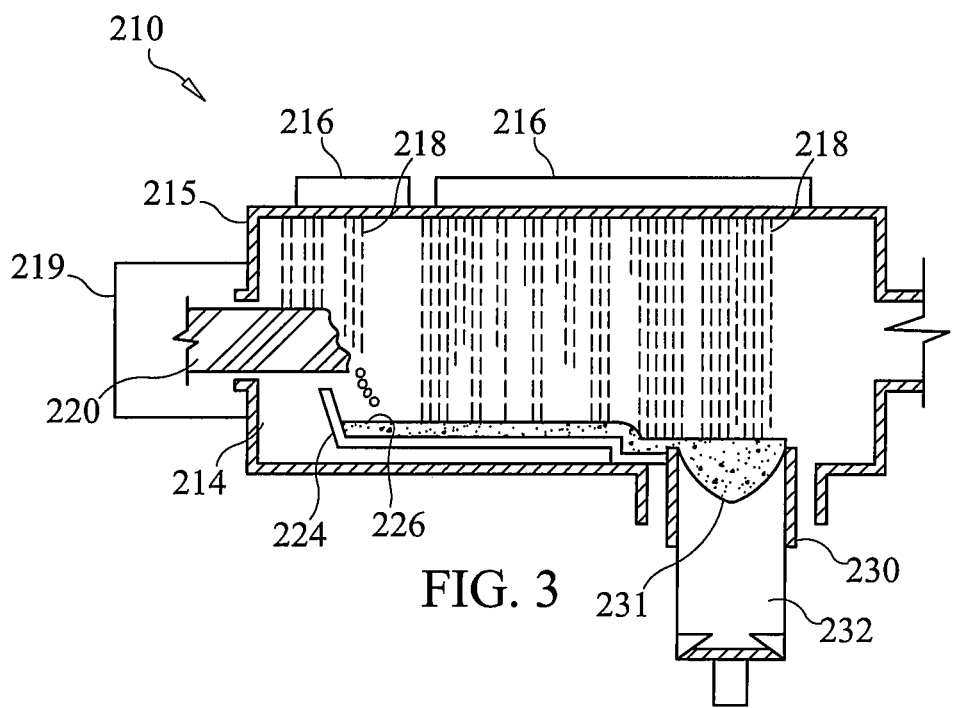
FIG. 3 is a schematic illustration in cross-section of one non-limiting embodiment of an electron beam cold hearth melting furnace including multiple wire-discharge ion plasma electron emitters according to the present disclosure.

FIG. 3 schematically illustrates one possible non-limiting embodiment of an improved electron beam melting furnace according to the present disclosure. Furnace 210 includes vacuum chamber 214 at least partially defined by chamber wall 215. Wire-discharge ion plasma electron emitters 216 are positioned outside and adjacent chamber 214. The wire-discharge ion plasma electron emitters 216 project wide-area electron fields 218 into the interior of the chamber 214. Similar to the conventional furnace 110 shown in FIG. 1, alloy bar 220 is introduced into chamber 214 by a bar feeder 219. Molten alloy 226 is produced by impinging the wide-area electron field 218 of at least one wire-discharge ion plasma electron emitter 216 onto bar 220. The molten alloy 226 melted from bar 220 drops into water-cooled copper hearth 224 and is resident in the hearth 224 for a certain dwell time, where it is heated, degassed, and refined by one or more of the wide-area electron fields 218 produced by emitters 216. The molten alloy 226 ultimately drops from hearth 224 into copper mold 230 and forms a molten pool 231. Molten pool 231 ultimately and progressively solidifies in mold 230 to form ingot 232. At least one of the wide-area electron fields 218 preferably heats the molten alloy within pool 231 in a manner advantageous to controlling the solidification rate of the forming ingot 232.

As discussed above, the wire-discharge ion plasma electron emitters 216 of furnace 210 are designed to generate a field or "flood" of energetic electrons covering a wide area relative to the spot coverage of the substantially linear beam produced by electron beam guns used in conventional electron beam furnaces. The electron field emitters 216 spread electrons over a wide area and impinge on the materials to be melted and/or maintained in the molten state within the furnace 210. Because the electron field it produces will cover a wide area within the furnace chamber, a wire-discharge ion plasma electron emitter will maintain a more even temperature within the electron beam melting furnace relative to a conventional electron beam furnace, and also dispenses with the need to raster a highly focused spot of electrons. Nevertheless, certain embodiments of the electron beam furnace according to the present disclosure may include components generating electric fields or other suitable components to steer the field of electrons generated by the one or more wire-discharge ion plasma electron emitters as desired. For example, in furnace 210 it may be desirable to raster the broad field produced by a wire-discharge ion plasma electron emitter 216 from side-to-side to provide additional heat to edges of the hearth 224. By flooding a relatively wide area with a field of energetic electrons, rather than rastering a point source of electrons across the area, the localized intense heating effect (e.g., power per unit area) associated with substantially linear electron beams that occurs when using conventional electron beam melting furnaces is significantly reduced. This eliminates or at least significantly reduces the extent to which relatively volatile alloying elements undesirably evaporate for the reason that points of relatively extremely high temperature are not produced. This, in turn, partially or wholly obviates the compositional control and contamination problems inherent in the conventional electron beam furnace design.

Figure 4:
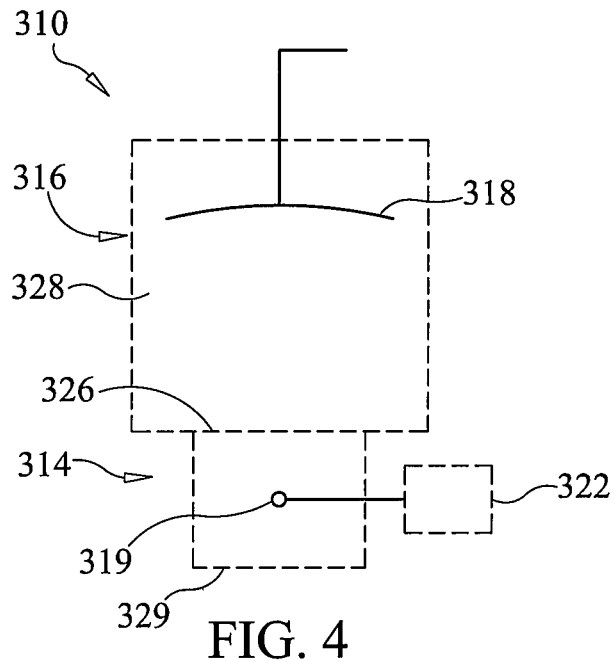
FIG. 4 is a schematic illustration of one non-limiting embodiment of a wire-discharge ion plasma electron emitter.

As noted above, various embodiments of wire-discharge ion plasma electron emitters generally include one or more elongate wire anodes producing positive ion plasma, wherein the plasma is impinged upon a cathode to generate a field of secondary electrons that may be accelerated to impinge on a target that is to be heated. A schematic representation of one known design of a wire-discharge ion plasma electron emitter, previously used in other, unrelated, applications, is shown in FIG. 4. This emitter 310 includes an ionization or plasma region 314 in which a positive ion plasma is produced, and a cathode region 316 that includes cathode 318. The plasma region 314 is filled with an ionizable gas at low pressure, and the gas is ionized in the plasma region to produce the cation-containing plasma. For example, the ionization region 314 may be filled with helium gas at, for example, approximately 20 mTorr. A small diameter elongate wire anode 319 passes through a length of the plasma region 314. A positive voltage is applied to wire anode 319 by power supply 322, and this initiates ionization of the helium gas into a plasma comprising helium cations and free electrons (the "primary" electrons). Once ionization of the helium gas is initiated, the plasma is sustained by applying a voltage to the thin wire anode 319. Positively charged helium ions within the plasma are extracted from the ionization chamber 314 through an extraction grid 326 maintained at a high negative electrical potential and accelerated through a high voltage gap into the cathode region 316, where the cations in the plasma impact high negative voltage cathode 318. Cathode 318 may be, for example, a coated or uncoated metal or alloy. Impingement of helium ions on cathode 318 releases secondary electrons from cathode 318. The high voltage gap 328 accelerates the secondary electrons in a direction opposite the direction of movement of the helium cations, through the extraction grid 326 and into the plasma region 314, and then through a thin metallic foil window 329 made of material relatively transparent to electrons. As noted above, depending on the relative gas pressures within the electron emitter and the furnace chamber, it may be possible to omit the foil window 329, in which case the electrons produced by the emitter would enter the furnace chamber directly.

The wire electrode 319 and the cathode 318 may be designed and arranged to better promote movement of the positively charged helium ions to the cathode 318. Also, the cathode 318 and the extraction grid 326 may be designed and arranged to maximize secondary electron transmission through the grid 326 and with a beam profile suitable for penetration through foil window 329, if present. The wide-area field of energetic electrons exiting the emitter 310 may be directed to impinge on a target positioned opposite foil window 329 and within the vacuum chamber of a melting furnace. Also, the window 329 may be sized to be as thin as possible in order to maximize electron transmission from emitter 310. An aluminum-type or titanium-type foil having a thickness allowing sufficient electron transmission, while also maintaining a soft vacuum environment within the emitter 310, may be used as foil window 329, if necessary. Other suitably strong and acceptably electron transparent materials that may be used as a window in the apparatus, if present, will be known to those having ordinary skill. As discussed generally herein, window 329 may be omitted if the pressure differences between the interior of the emitter 310 and the vacuum chamber containing the target are not significant.

Figure 5:
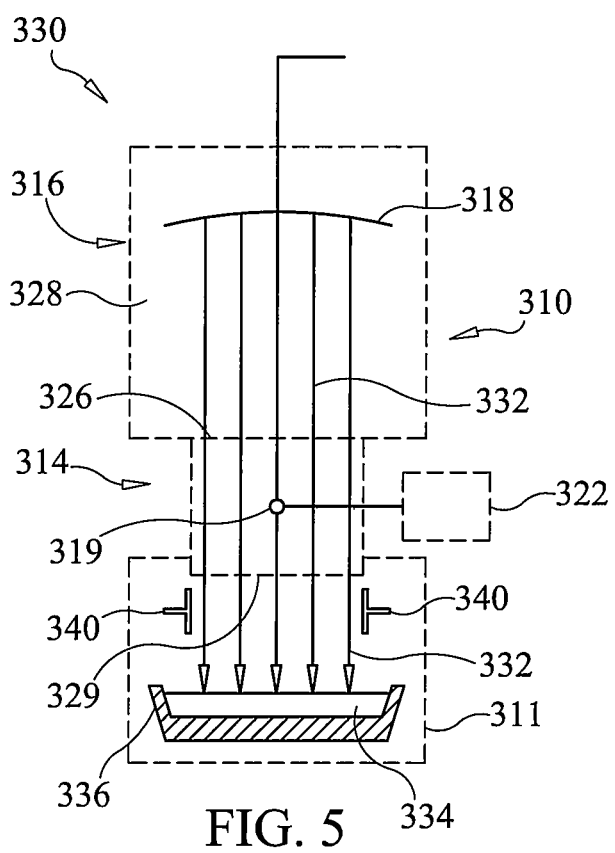
FIG. 5 is a schematic illustration of one non-limiting embodiment according to the present disclosure of an electron beam melting furnace including a wire-discharge ion plasma electron emitter as an electron source.

According to the present disclosure, one or more wire-discharge ion plasma electron emitters, such, for example, emitter 310, may be provided to supply the energetic electrons into the vacuum chamber of an electron beam melting furnace, as a substitute for electron beam guns producing a substantially linear electron beam. As shown in FIG. 5, one non-limiting embodiment of an electron beam melting furnace 330 according to the present disclosure includes one or more wire-discharge ion plasma electron emitters 310 positioned adjacent vacuum chamber 311. Wide-area electron field 332 exits emitter 310 through film window 329 and floods at least a region of the surface of the molten alloy 334 in hearth 336, thereby heating the alloy to maintain it in a molten state. Because the electrons impinging on the alloy in hearth 336 are spread across a relatively wide area, the energy focused on the molten material in any particular localized region is not great enough to result in a problematic level of volatilization of elements from the alloy, thereby reducing or obviating the alloy contamination and heterogeneity problems inherent in the use of conventional electron beam melting furnaces. As noted above, film window 329 may be omitted if the operating pressure differential between the emitter 310 and the vacuum chamber 311 is not significant. Also, as noted above, the vacuum chamber 311 preferably is operated at a pressure higher than is conventional in order to further reduce or eliminate undesirable elemental vaporization, and in such case the need for a film window partitioning the electron emitter from the furnace chamber will, again, depend on the particular pressure differential inherent in the design.

Optionally, components 340 for magnetically steering the wide-area electron field are provided so as to allow further improved control of the melting process within the vacuum chamber 311.

Although FIG. 5 provides a simplified view of one embodiment of a wire-discharge ion plasma electron melting furnace according to the present disclosure including a single electron emitter, it will be apparent to those of ordinary skill that actual or alternate embodiments of such an apparatus may have multiple wire-discharge ion plasma electron emitters. It also will be apparent that one or more wire-discharge ion plasma electron emitters may be incorporated in such an apparatus to: (1) melt raw materials introduced into the furnace, in the form of, for example, an alloy bar or wire; (2) maintain molten alloy resident in the furnace hearth at a temperature above the alloy melting temperature (and possibly degas and/or refine the molten alloy); and (3) maintain desired regions of the molten pool on the surface of the incrementally advancing cast ingot in a molten state, thereby influencing ingot solidification rate in a desired manner. Also, in certain embodiments, one or more wire-discharge ion plasma electron emitters may be used along with one or more electron beam guns producing conventional substantially linear electron beams.

Figure 6:
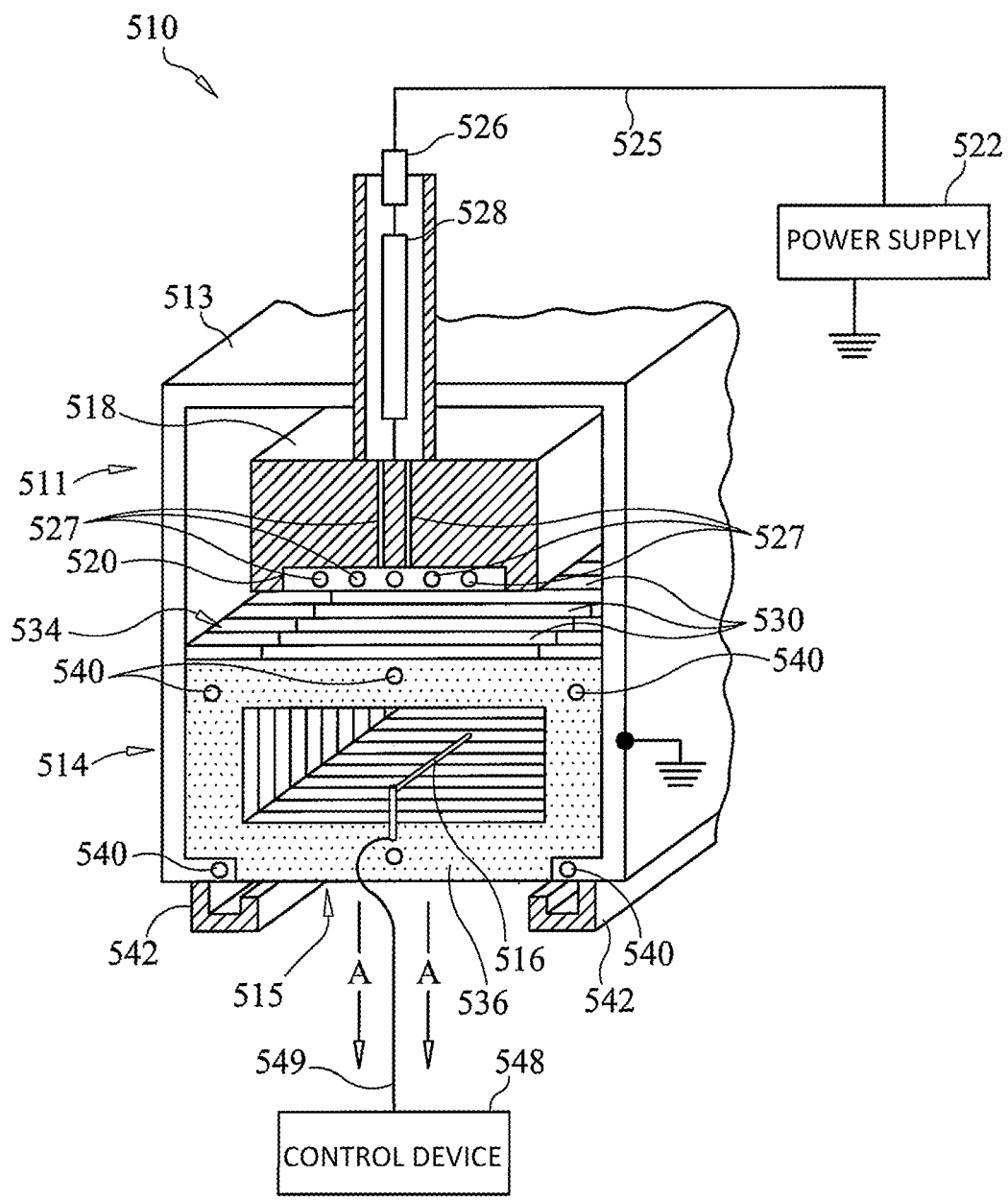
FIG. 6 is a perspective view, partly in section, of one non-limiting embodiment of a wire-discharge ion plasma electron emitter that may be adapted for use in an electron beam melting furnace according to the present disclosure.
Figure 7:
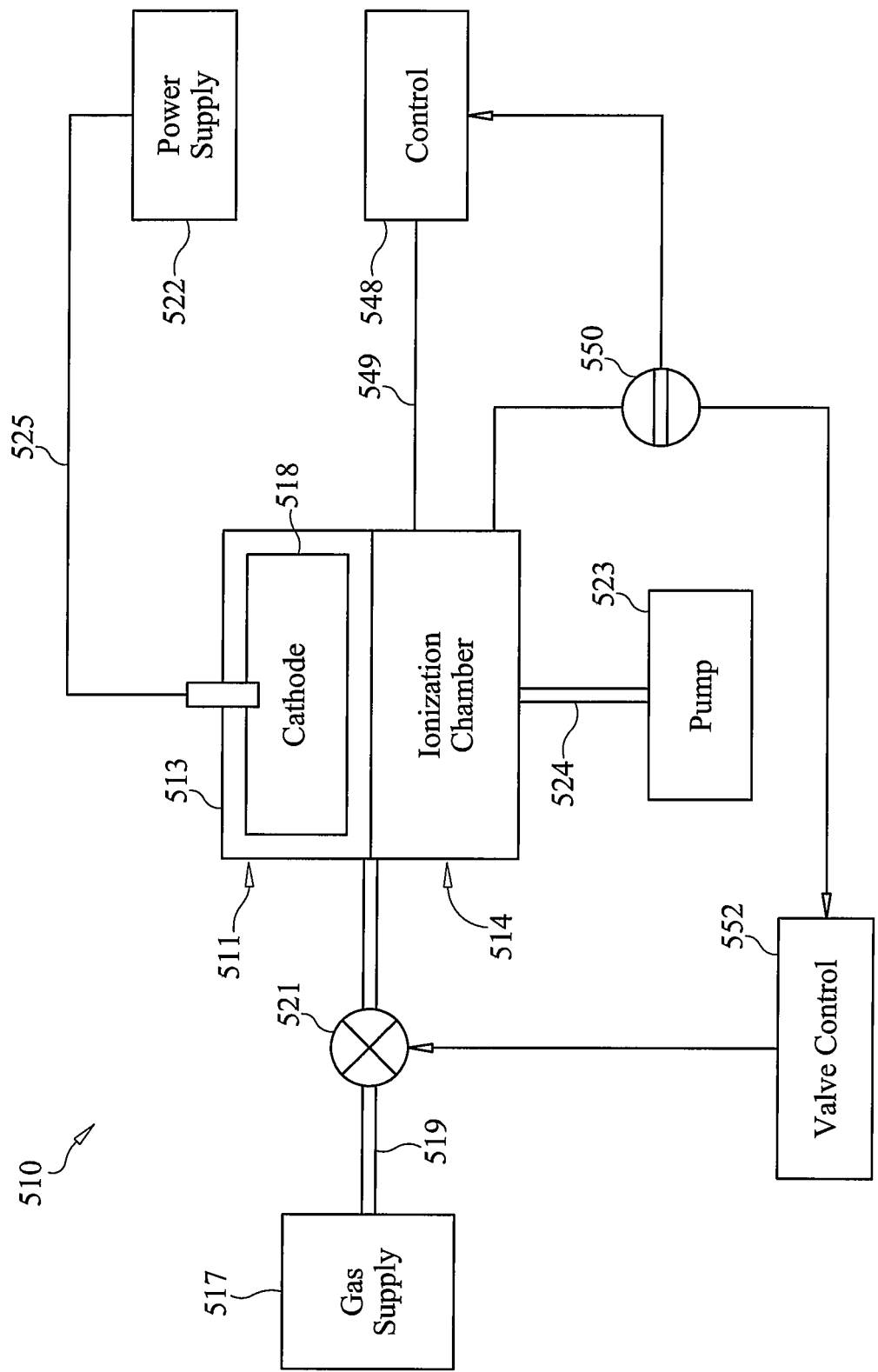
FIG. 7 is a diagram illustrating operation of the wire-discharge ion plasma electron emitter illustrated in FIG. 6.

FIGS. 6 and 7 provide additional details related to one possible non-limiting embodiment of a wire-discharge ion plasma electron emitter 510 that may be adapted for use as the source of energetic electrons in an embodiment of an electron beam melting furnace according to the present disclosure. FIG. 6 is a perspective view, partly in section, of the wire-discharge ion plasma electron emitter embodiment 510. FIG. 7 is a schematic diagram illustrating, in a simplified way, the operation of emitter 510. Emitter 510 includes electrically grounded enclosure 513, which includes cathode region 511, ionization or plasma region 514, and electron transmissive foil window 515. Elongate wire electrode 516 extends through a length of ionization region 514. Foil window 515 is electrically coupled to chamber 513 and thereby forms an anode that operates to accelerate electrons within chamber 513 therethrough to exit chamber 513 in the general direction of arrows "A". Chamber 513 is filled with helium gas at low pressure, such as 1-10 mTorr, and is supplied with the gas by gas supply 517. Gas supply 517 is connected to enclosure 513 by conduit 519, which passes through valve 521. A soft vacuum environment is maintained in chamber 513 by pump 523, which is connected to chamber 513 by conduit 524.

Cathode region 511 includes cathode 518, which in turn includes insert 520 mounted on a lower surface thereof. The insert 520 may be composed of, for example, molybdenum, but may be composed of any material with a suitably high secondary electron emission coefficient. Cathode 518 is suitably uniformly spaced from the walls of enclosure 513 to prevent Paschen breakdown. Cathode 518 is coupled to high voltage power supply 522 by cable 525 which passes through insulator 526 and into resistor 528. Power supply 522 supplies a high negative potential, for example, 200-300 KV, to cathode 518. Cathode 518 and insert 520 may be suitably cooled, such as by, for example, circulating oil or another suitable cooling fluid through conduits 527.

Ionization region 514 includes a plurality of thin metallic ribs 530 which are coupled both electrically and mechanically. Each rib 530 includes a central cut-out region to allow wire electrode 516 to pass through the ionization chamber 514. The sides of ribs 530 facing cathode 518 form an extraction grid 534. The opposed side of all or a portion of the ribs 530 provide a support grid 536 for electron transmissive foil window 515. Cooling channels 540 may be provided to circulate a cooling fluid through and in the vicinity of ribs 530 to allow for heat removal from ionization region 514. Electron transmissive foil window 515, which may be composed of, for example, aluminum or titanium foil, is supported on grid 536 and is sealed to enclosure 513 by an O-ring or other structures sufficient to maintain the high vacuum helium gas environment within enclosure 513. In certain embodiments of emitter 510, a gas manifold is provided to cool foil window 515, such as with pressurized nitrogen. As discussed generally herein, window 515 may be omitted if the pressure differences between the interior of the chamber 513 of emitter 510 and the chamber containing the target of the electron field are not significant.

An electrical control device 548 is connected to wire electrode 516 through connector 549. On activation of control device 548, wire electrode 516 is energized to a high positive potential, and helium within ionization region 514 is ionized to produce plasma including helium cations. Once the plasma is initiated in ionization region 514, cathode 518 is energized by power supply 522. Helium cations in the ionization region 514 are electrically attracted to cathode 518 by the electric field that extends from the cathode 518 into the plasma region 514. The helium cations travel along the field lines, through the extraction grid 534, and into the cathode region 511. In the cathode region 511, the helium cations accelerate across the full potential of the electric field generated by the energized cathode 518 and forcefully impinge on the cathode 518 as a collimated beam of cations. The impacting cations free secondary electrons from the insert 520. The secondary electron field produced by the insert 520 is accelerated in a direction opposite the direction of travel of the helium cations, toward the wire electrode 516, and through foil window 515, if present.

Means may be provided to monitor the actual gas pressure within the chamber 513 as changes in pressure may affect the density of the helium ion plasma and, in turn, the density of the secondary electron field generated at the cathode 518. An initial pressure may be set within enclosure 513 by appropriately adjusting valve 521. Once the cation-containing plasma is initiated in plasma region 514, a voltage monitor 550 may be provided to indirectly monitor the instantaneous quiescent pressure within the chamber 513. A rise in voltage is indicative of a lower chamber pressure. The output signal of the voltage monitor 550 is used to control valve 521, through valve controller 552. The current supplied to wire electrode 516 by control device 548 also is controlled by the signal of voltage monitor 550. Utilizing the signal generated by voltage monitor 550 to control gas supply valve 521 and control device 548 allows for a stable electron field output from emitter 510.

The current generated by emitter 510 may be determined by the density of the cations impacting the cathode 518. The density of the cations impacting the cathode 518 may be controlled by adjusting the voltage on wire electrode 516 through control device 548. The energy of the electrons emitted from the cathode 518 may be controlled by adjusting the voltage on the cathode 518 through power supply 522. Both current and energy of the emitted electrons can be independently controlled, and the relationships between these parameters and the applied voltages are linear, rendering control of the emitter 510 both efficient and effective. In contrast, conventional thermo-ionic electron beam guns cannot be controlled in a corresponding linear manner when adjusting beam parameters.

Figure 8:
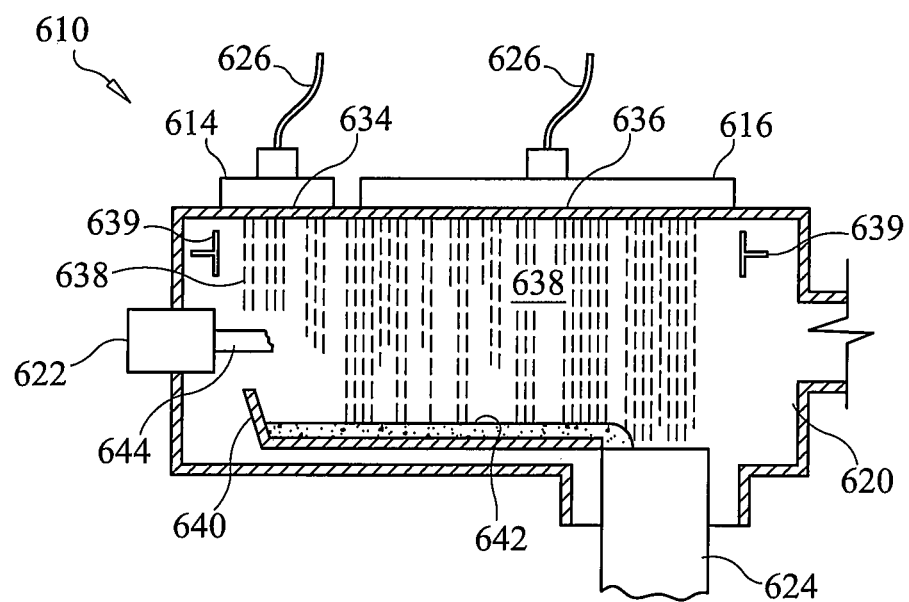
FIG. 8 is a schematic illustration in cross-section of one embodiment of an electron beam cold hearth melting furnace according to the present disclosure.

FIG. 8 is a schematic illustration of one embodiment of an electron beam melting furnace according to the present disclosure, wherein the furnace 610 incorporates two wire-discharge ion plasma electron emitters 614, 616 having a design as generally shown in FIGS. 6 and 7 and as discussed above in connection with those figures. Furnace 610 includes vacuum chamber 620, material feeder 622, and casting or atomizing device 624. Current required for operation of emitters 614 and 616, as discussed above, is fed to the emitters by power lines 626, and the interface between emitters 614, 616 and the vacuum chamber 620 includes electron transmissive foil windows 634, 636, which allow the electron fields 638 generated by the emitters 614, 616 to enter the vacuum chamber 620. The foil windows 634, 636 may be omitted if the operating pressures within the emitters 614, 616 and the vacuum chamber are identical or do not significantly differ. Means 639 for magnetically steering electron fields 638 may be included within vacuum chamber 620 to provide additional process control. A hearth 640, which may be, for example, a cold hearth, is disposed in vacuum chamber 620. In operation, wire-discharge ion plasma electron emitters 614, 616 are energized and generate electron fields 618. An electrically conductive feed material 644 is introduced into the vacuum chamber 620 by feeder 622, is melted by electron field 638 emitted from emitter 614, and drops to hearth 640. Wide-area electron field 638 emitted by emitter 616 heats, degasses, and refines the molten material 642 while resident in hearth 640. Molten material 642 advances along the hearth 640 and drops into casting or atomizing device 624 and is processed to a desired form.

The various non-limiting embodiments of the ion plasma electron emitters, such as the wire-discharge ion plasma electron emitters discussed above, for example, of the present disclosure may operate at vacuum pressures higher than the conventional thermo-ionic electron beam guns. Operation of a melting furnace at these higher pressures may reduce the volatilization of volatile elements within the materials being melted, as also discussed in further detail above. However, if any of these volatile elements do boil off from the molten material, even under the higher vapor pressure conditions in the melting furnace, and condense on the relatively cold chamber walls of the melting furnace, the condensate formed could detach from the chamber walls and fall into the melt. Condensate falling into the melt may contaminate the melt with inclusions and/or produce localized variations in the melt chemistry. The inventor perceived that it would be advantageous to develop apparatuses and methods to prevent or inhibit the formation of such condensate in ion plasma electron emitter melting furnaces and other types of melting furnaces.

As such, the present disclosure, in part, is directed to an apparatus including at least one auxiliary electron emitter in the form of an ion plasma electron emitter, such as a wire-discharge ion plasma electron emitter, for example, that is configured to be used with a melting furnace comprising one or more other ion plasma electron emitters, such as wire-discharge ion plasma electron emitters, for example, for melting an electrically conductive metallic material. Another non-limiting embodiment according to the present disclosure is directed to an apparatus including at least one auxiliary electron emitter in the form of an ion plasma electron emitter, such as an auxiliary wire-discharge ion plasma electron emitter, for example, that is configured to be used with a melting furnace comprising one or more thermo-ionic electron beam guns and/or other melting devices. Because the auxiliary electron emitter according to the present disclosure comprises an ion plasma electron emitter as an electron source, it is referred to herein as an auxiliary ion plasma electron emitter, as an auxiliary electron emitter, or, in one exemplary embodiment, as an auxiliary wire-discharge ion plasma electron emitter. Those of skill in the art will recognize, upon review of the present disclosure, that although the wire-discharge ion plasma electron emitters and the auxiliary wire-discharge ion plasma electron emitters are discussed in detail herein, any other suitable ion plasma electron emitters or auxiliary ion plasma electron emitters can be used and are within the scope of the present disclosure. Examples of other suitable ion plasma electron emitters and other suitable auxiliary ion plasma electron emitters are discussed in further detail below. Further, as discussed below, the "wire" of the wire-discharge ion plasma electron emitters and the auxiliary wire-discharge ion plasma electron emitters can be formed into any suitable shape, such as circular-shaped, linear-shaped, square-shaped, rectangular-shaped, ovate-shaped, elliptical-shaped, or triangular-shaped, for example, to form electron fields having variously shaped cross-sectional areas or profiles.

In certain non-limiting embodiments, the auxiliary electron emitter according to the present disclosure may comprise a wire-discharge ion plasma electron emitter that is configured and functions in a way that is the same as or is similar to the various wire-discharge ion plasma electron emitters discussed above. For example, the auxiliary wire-discharge ion plasma electron emitter may comprise a plasma region including a wire electrode, such as an elongate wire anode, configured to produce plasma including positive ions, and a cathode region including a cathode electrically connected to a high voltage power supply configured to negatively charge the cathode. In various non-limiting embodiments, the cathode may be positioned relative to the wire electrode so that positive ions generated by the wire electrode are accelerated toward and impinge on the cathode, liberating electrons from the cathode and creating an electron field, such as a focused electron field, for example. The focused electron field can be electromagnetically "focused" and/or directed to appropriate regions of the melting chamber through the use of electromagnets, for example. For purposes of the present disclosure, the phrase "focused electron field" means a field having a cross-sectional area, at least after being electromagnetically focused, that is smaller than a cross-sectional area of a field of electrons emitted by the various ion plasma electron emitters discussed above (referred to hereafter as "wide-area electron field"). The focusing of the electron fields can make the electron fields higher powered by providing a greater electron density per unit area, for example. It will be understood that when referring to a "cross-sectional area" or a "cross-sectional profile" of an electron field in the present disclosure, that the cross-sections will be taken in a direction substantially perpendicular to a path of travel of the various electron fields at a particular instant in time.

In certain non-limiting embodiments, the auxiliary wire-discharge ion plasma electron emitter may operate at a higher power than the various wire-discharge ion plasma electron emitters discussed above to provide higher power, higher electron density, and/or focused electron fields when compared to the lower powered, less dense, and less focused electron fields generated by the various wire-discharge ion plasma electron emitters discussed above. In one exemplary embodiment, if the cathode is charged to a higher negative voltage, then the electron energy of the electron field will be greater owing to the higher electron energy of free electrons coming off of the cathode. Additionally, if a higher voltage is applied to the anode, then the density of the electrons of the electron field will be greater owing to a greater number of ions being produced at the anode. In another exemplary embodiment, the higher voltage can be applied to both the anode and the cathode (negative voltage) to produce a higher energy and denser electron field. This electron field can then be electromagnetically focused and/or directed to portions of the melt. As such, the focused electron field of such embodiments may be used to melt condensate, condensate within the melt, solidified portions within the melt, and/or unmelted portions within the melt, for example. The focused electron field may also be used to maintain the molten material within a vacuum chamber of a melting furnace at a suitable temperature at various regions of the vacuum chamber. The higher energy, denser, and/or more focused electron field may be used because of the limited residence time of the condensate, solidified portions, and/or unmelted portions within the melt in regions of the vacuum chamber. As such, it is desirable to melt the condensate, solidified portions, and/or unmelted portions prior to them moving into another region of the vacuum chamber. The auxiliary wire-discharge ion plasma electron emitter may also be adapted or steerable so that the direction of the focused electron field generated by the auxiliary electron emitter may be moved and/or directed to any other appropriate region within the vacuum chamber of the melting furnace, for example, so that it impinges on a particular desired target. In one non-limiting embodiment, the focused electron field may be impinged on a region of a forming or solidifying ingot to advantageously influence solidification kinetics of the molten pool 231 and, therefore, characteristics of the solid ingot 232, for example.

Those of skill in the art will recognize that the auxiliary wire-discharge ion plasma electron emitters of the present disclosure may comprise, for example, any suitable features of the various wire-discharge ion plasma electron emitters described above. As such, and for sake of brevity, those features are not specifically recited again in this section with respect to the auxiliary wire-discharge ion plasma electron emitters. It will be understood that any component, element, and/or portion in FIGS. 9-15 having a reference number that is the same as any component, element, and/or portion in FIGS. 1-8, described above, may be the same or similar and may have the same or similar structure and/or function. Also, any of the components, elements, and/or portions described above with respect to the various exemplary embodiments illustrated in FIGS. 1-8 may be used in conjunction with the various exemplary embodiments described in FIGS. 9-15.

Figure 9:
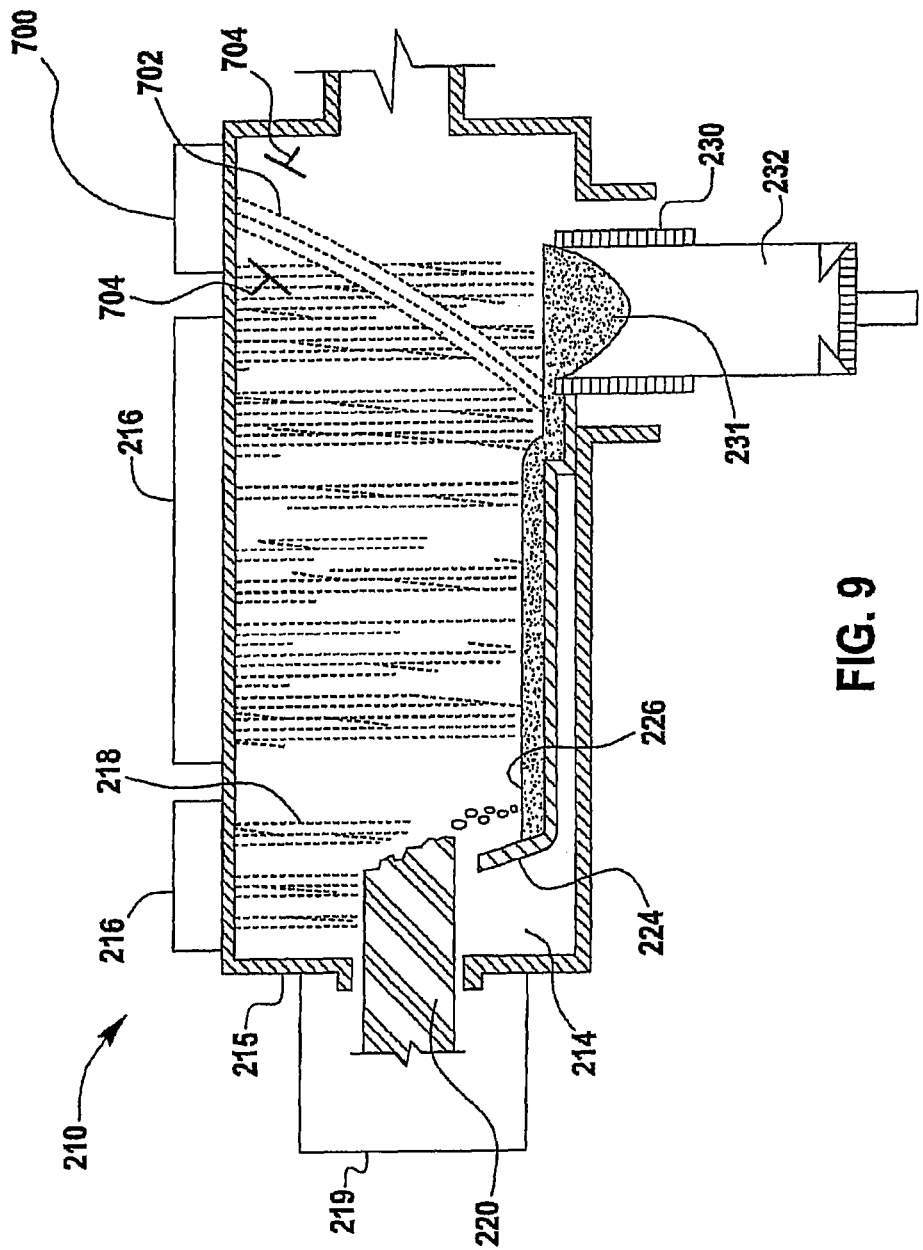
FIG. 9 is a schematic illustration in cross-section of one non-limiting embodiment of an electron beam cold hearth melting furnace including multiple ion plasma electron emitters and an auxiliary ion plasma electron emitter according to the present disclosure.

In one non-limiting embodiment, referring to FIG. 9, an auxiliary wire-discharge ion plasma electron emitter 700 may be positioned in or adjacent to a vacuum chamber 214 of a melting furnace 210. The auxiliary wire-discharge ion plasma electron emitter 700 may be used in conjunction with or independent of the one or more wire-discharge ion plasma electron emitters 216. In one non-limiting embodiment, one or more wire-discharge ion plasma electron emitters 216 may be used to heat and melt the bar 220 of metallic material, and one or more wire-discharge ion plasma electron emitters 216 may be used to heat and refine molten metallic material 226 in the hearth 224. In certain non-limiting embodiments, the auxiliary wire-discharge ion plasma electron emitter 700 may be used to melt any condensate formed on the walls 215 of the vacuum chamber 214 and/or melt any solidified portions, including condensate, in the melted metallic material present in the hearth 224. In other non-limiting embodiments, the auxiliary wire-discharge ion plasma electron emitter can be used to heat the molten pool 231 or other regions of the forming or solidifying ingot 232, as discussed herein.

Accordingly, in various non-limiting embodiments, the auxiliary wire-discharge ion plasma electron emitter 700 may be adapted to selectively melt condensate formed on the chamber wall 215 and thereby prevent or reduce the possibility of solid condensate detaching from the chamber wall 215 and falling into the molten material 226. Also, in various non-limiting embodiments, the auxiliary wire-discharge ion plasma electron emitter 700 may be adapted to provide additional heating at desired regions along the hearth 224, for example, to melt solids, such as the condensate, for example, within the molten material 226 and/or to maintain the molten material 226 in a molten state at one or more regions along the hearth 224. Additionally, in various non-limiting embodiments, the auxiliary wire-discharge ion plasma electron emitter 700 may be adapted to heat regions of the molten pool 231 and advantageously influence solidification kinetics of the molten pool 231 and characteristics of the ingot 232. Application of a focused electron field emitted by the auxiliary wire-discharge ion plasma electron emitter 700 to the molten pool 231 may improve the surface finish of the ingot 232 during withdrawal, minimize metal tearing within the ingot 232, and/or advantageously influence the resulting microstructure of the ingot 232, for example.

In one non-limiting embodiment, still referring to FIG. 9, the auxiliary wire-discharge ion plasma electron emitter 700 is configured to produce a focused electron field, such as focused electron field 702, for example. This focused electron field 702 is a three-dimension field of electrons and, therefore, when impinging on a target, covers a region much greater than the essentially linear "beam" of electrons generated by a conventional thermo-ionic electron beam gun. The focused electron field 702, however, may cover a region having an area less or much less than the region covered by the relatively wide-area electron field 218, for example, emitted by the wire-discharge ion plasma electron emitter 216, as discussed above. In one non-limiting embodiment, the focused electron field 702 may have an area of 0.5 square inches to 50 square inches, alternatively 1 square inch to 30 square inches, and alternatively 1 square inch to 20 square inches, for example, when it impinges on a target in the vacuum chamber of a melting furnace. The focused electron beam, in certain embodiments, is steerable, or at least directable, such that it can be impinged on condensate or other solid portions within the melt. Those of skill in the art, upon considering the present disclosure, will recognize that the focused electron field may have any suitable cross-sectional areas or profiles for particular applications.

In one non-limiting embodiment, the cross-sectional area and/or the cross-sectional shape of the focused electron field 702 may be a function of the size and shape of the anode and/or the cathode of an auxiliary electron emitter, for example. For example, in certain non-limiting embodiments, the anode and the cathode are of a relatively large size and the focused electron field 702 covers a relatively large cross-sectional area. This relatively large cross-sectional area, however, is generally smaller than a cross-sectional area of the wide-area electron field, but substantially larger than the essentially "spot" coverage of the substantially linear "beam" emitted by a conventional thermo-ionic electron emitter. The focused electron field can also comprise various cross-sectional shapes, such as circular or square, for example, based on the shape of the anode. In one non-limiting embodiment, an anode having a circular shape can be used, in conjunction with a cathode, to produce a focused electron field having a circular or substantially circular cross-sectional shape, for example.

In one non-limiting embodiment, again referring to FIG. 9, the wire-discharge ion plasma electron emitters 216 may emit at least one first field of electrons 218 (i.e., a wide-area electron field) having a first cross-sectional area. The auxiliary wire-discharge ion plasma electron emitter 700 may emit a second field of electrons, such as the focused electron field 702, having a second cross-sectional area. In various embodiments, the first cross-sectional area may be larger than, the same as, or smaller than the second cross-sectional area. In connection with describing a particular field of electrons, the term "area" may refer to an area of coverage of the field of electrons when the field of electrons is impinged upon condensate, solid portions within the molten material, regions of a forming or solidifying ingot, and/or other regions of the vacuum chamber.

In one non-limiting embodiment, the focused electron field 702 emitted by the auxiliary wire-discharge ion plasma electron emitter 700 has a smaller cross-sectional area than the wide-area electron field emitted by the wire-discharge ion plasma electron emitter 216. In that embodiment, the focused electron field 702 may be more focused and optionally of a higher power (e.g., higher electron density and/or higher energy electrons) than the wide-area electron field emitted by the wire-discharge ion electron emitter 216. The higher electron density of the focused electron field 702 can be created by applying a higher voltage to the anode, for example, to create more ions at the anode and, therefore, create more secondary electrons coming from the cathode. The power of the focused electron field 702 can be increased or decreased for suitable melting of condensate or solid portions of the melt. In such an embodiment, the electron accelerating voltage (kV) of the cathode and the electron current (kW) can be varied for suitable melting, for example. In one non-limiting embodiment, the electron current (kW) can be increased to cause faster melting. In other non-limiting embodiments, the focused electron field 702 can also be further focused to increase the density of the electrons within the focused electron field 702 and, thereby, cause faster melting.

In one non-limiting embodiment, the focused electron field 702 may be directed toward any condensate, solidified portions, and/or unmelted portions within the molten alloy 226 or the molten pool 231. In addition, in certain embodiments, the focused electron field 702 may be directed toward to the molten pool 231 to influence the solidification of the molten material into the ingot 232. The focused electron field 702 may also be directed to regions of the chamber walls 215 having condensate thereon to melt the condensate or to other regions of the melting furnace 210.

With reference again to FIG. 9, the focused electron field 702 may be directed by a steering system, such as, for example, steering system 704. The steering system 704 may generate and manipulate one or more electric fields and/or magnetic fields, for example, to steer the focused electron field 702 to impinge it on a desired region or thing within the vacuum chamber 214 of the melting furnace 210. Conventional techniques and apparatus known to those having ordinary skill in the art for manipulating the direction of electron fields, such as magnetic deflection, for example, may be suitably adapted for use in the steering system 704. Given that such techniques and apparatus for manipulating electron fields are known to those having ordinary skill in the art, they are not described in detail herein. Also, for example, the steering system 704 may be designed to selectively raster the focused electron field 702 generated by the auxiliary ion plasma electron emitter 700 about a particular region within the vacuum chamber 214 of the melting furnace 210. Various conventional techniques and apparatus are known to those having ordinary skill in the art for rastering electron beams and may be suitably adapted for use in the steering system 704. Given that such techniques and apparatus for rastering electron fields are known to those having ordinary skill, they are not described in detail herein. In one non-limiting embodiment, rastering the focused electron field 702 may quickly move the field over a region of condensed material on the chamber wall 215 to melt the condensate, over a solidified portion or unmelted portion of material within the hearth 224 to melt the material, and/or over the molten pool 231 to influence the solidification of the forming ingot 232 as desired. Rastering the focused electron field 702 may also be employed to eliminate or help to at least reduce the possibility that an excess of power or energy will be transferred by the focused electron field 702 to the condensate, the solidified portions, and/or the molten material on which the focused electron field 702 impinges. Application to the condensate, the solidified portions, and/or the molten material of an excess of electron energy/unit area and/or an electron density/unit area could vaporize the volatile elements within the condensate or material, which could exacerbate condensation of material on the chamber walls 215. In one non-limiting embodiment, the steering system 704 may be used to direct the focused electron field 702 to any suitable location within the melting furnace 210.

In one-non-limiting embodiment, a steering system for the focused electron field 702 can be selectively operated such that an operator can specifically direct the focused electron field 702 to particular portions of the melt that require melting and/or reheating. Such a selective steering system can move the steering devices 704, or other steering devices, to thereby direct the focused electron field 702 to suitable regions within the vacuum chamber, such as over condensate particles within the melt. In other non-limiting embodiments, various steering devices, such as electromagnets, for example, can be properly arrayed within the vacuum chamber such that the focused electron field 702 can be directed to a predetermined region of the vacuum chamber and/or can be selectively movable by an operator between a first predetermined region of the vacuum chamber and a second predetermined region of the vacuum chamber, for example.

Figure 10:
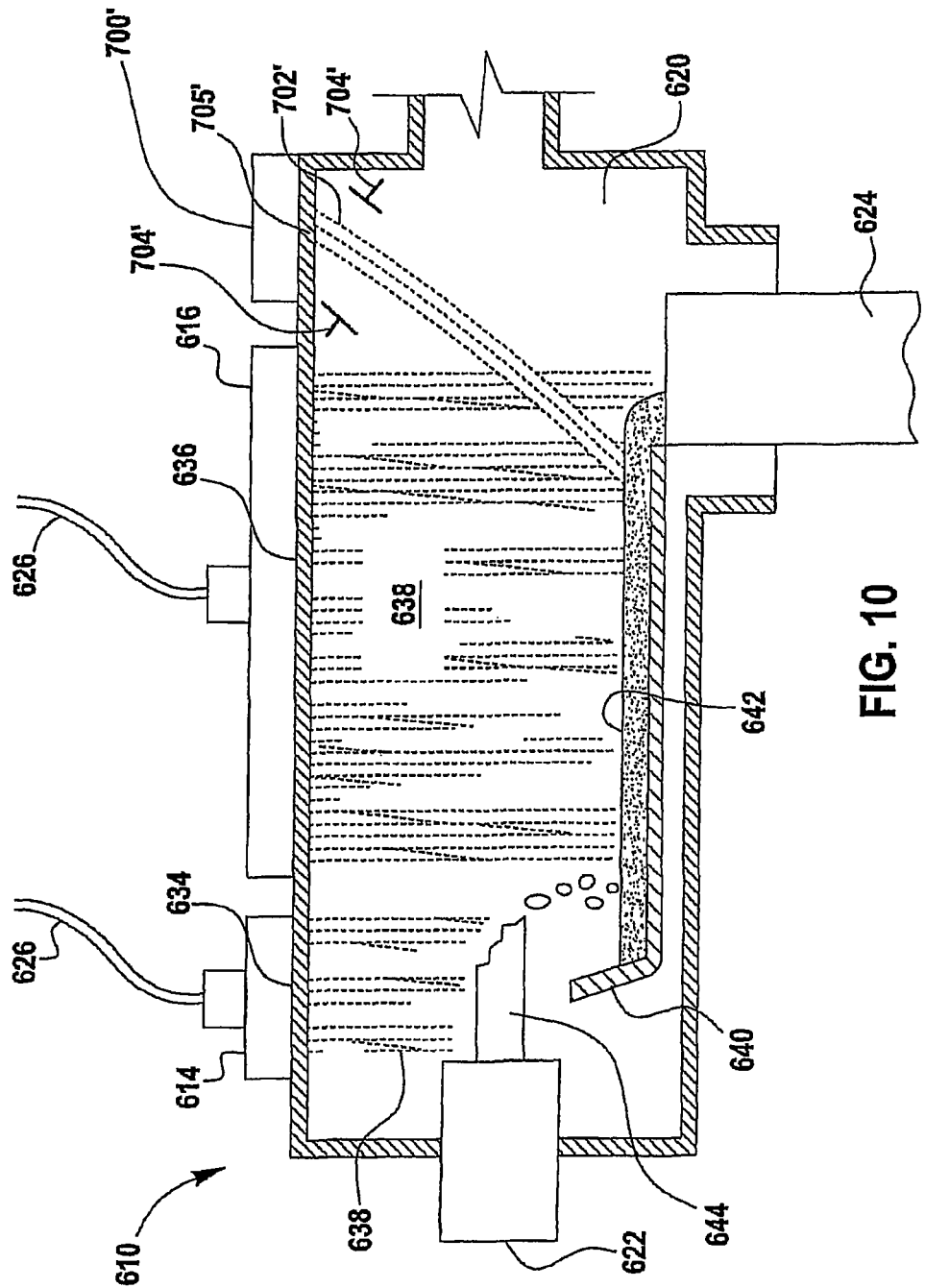
FIG. 10 is a schematic illustration in cross-section of one non-limiting embodiment of an electron beam cold hearth melting furnace including an auxiliary ion plasma electron emitter according to the present disclosure.

FIG. 10 illustrates another non-limiting embodiment of an auxiliary ion plasma electron emitter 700', such as a wire-discharge ion plasma electron emitter, for example, included in an electron beam melting furnace 610. Various elements of the electron beam melting furnace 610 are identified by reference numbers included in FIG. 8 and described above. The auxiliary ion plasma electron emitter 700' may emit a focused electron field 702', similar to the focused electron field 700, that may be impinged on the molten material 642 disposed in the hearth 640 and/or solids (such as, for example, condensate that has fallen from the chamber wall) within the molten material 642. In one non-limiting embodiment, the auxiliary ion plasma electron emitter 700' may include a steering system 704', which may have a construction as discussed above, for example.

Figure 11:
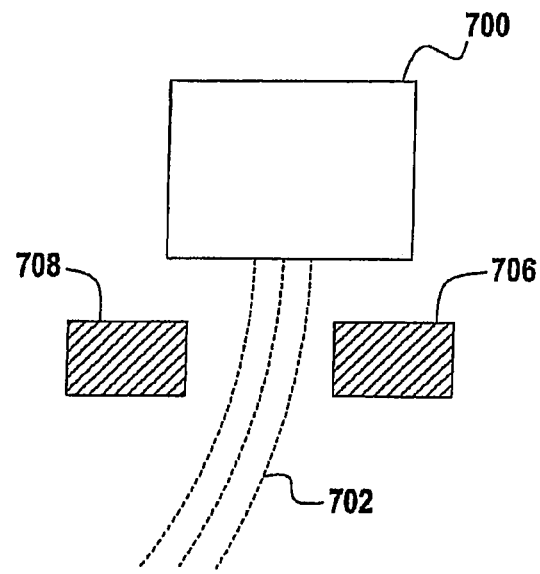
FIG. 11 is a schematic illustration of one non-limiting embodiment of a steering system for an auxiliary ion plasma electron emitter according to the present disclosure.

In one non-limiting embodiment depicted schematically in FIG. 11, an exemplary steering system is adapted for use in conjunction with the auxiliary ion plasma electron emitter 700 or 700' (referred to collectively as "700"). The steering system for the focused electron field 702 of the auxiliary ion plasma electron emitter 700 may comprise a first magnetic and/or electric steering device 706 and a second magnetic and/or electric steering device 708. The first steering device 706 may be positioned on a first side of the focused electron field 702, and the second steering device 708 may be positioned on a second side of the focused electron field 702. The first and second steering devices 706 and 708 may be configured to generate a magnetic and/or electric field therebetween that is translatable to direct the focused electron field 702 in a desired direction. As a result, the first and second steering devices 706 and 708 may be used to direct the focused electron field 702 to a desired region or location within a vacuum chamber of a melting furnace. The steering system can include additional steering devices such that the focused electron field 702 can be directed in any suitable direction within the vacuum chamber. The exemplary steering system illustrated in FIG. 11 can also be used to focus or further focus the focused electron field 702.

Figure 12:
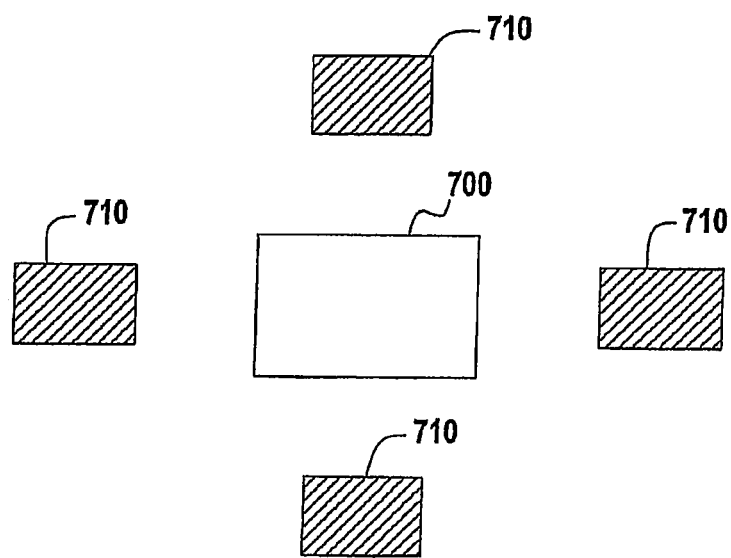
FIG. 12 is a schematic illustration from a top perspective of one non-limiting embodiment of a steering system for an auxiliary ion plasma electron emitter according to the present disclosure.

Another non-limiting embodiment of a steering system for the focused electron field 702 is schematically depicted in FIG. 12. In such an embodiment, the steering system may comprise more than one steering device 710 positioned about the focused electron field 702 (not illustrated in FIG. 12, but projecting in a path into and generally perpendicular to the page). Similar to the first and second steering devices 706 and 708 above, the steering devices 710 may each generate a magnetic and/or an electric field configured to act upon the focused electron field 702. By providing more than one, more than two, or more than three, for example, steering devices 710, the focused electron field 702 may be precisely directed to any desired region or object within the vacuum chamber of the melting furnace. Those of skill in the art will recognize that other conventional systems for steering electron fields may be used in conjunction with the auxiliary ion plasma electron emitters described herein to steer a direction of the focused electron field 702. Similar to the exemplary steering system of FIG. 11, the exemplary steering system of FIG. 12 can also be used to focus or further focus the focused electron field 702.

In one non-limiting embodiment, an apparatus for melting an electrically conductive metallic material may comprise an auxiliary wire-discharge ion plasma electron emitter configured to produce a focused electron field including a cross-sectional profile having a first shape and a steering system configured to direct the focused electron field to impinge on at least a portion of the electrically conductive metallic material to melt any solid condensate or other solids therein. The focused electron field may also be directed by the steering system onto the molten pool or other regions of a forming or a solidifying ingot to advantageously influence solidification kinetics of the ingot. In such a non-limiting embodiment, the apparatus may comprise a wire electrode having a second shape and a cathode having a third shape. In at least one embodiment, the first shape may be substantially similar to or the same as the second shape and/or the third shape. The first shape of the cross-sectional profile of the electron field may be substantially circular-shaped, triangular-shaped, rectangular-shaped, square-shaped, elliptical-shaped, or ovate-shaped, for example, or may be any other suitable shape. Thus, those of ordinary skill in the art will recognize that the first shape of the cross-sectional profile of the focused electron field may be any shape suitable for melting condensate, melting solids within the melt, melting unmelted portions of metallic material within the melt, and/or heating the molten pool of the solidifying ingot in a desired manner. If, for example, a focused electron field having a substantially triangular-shaped cross-sectional profile is desired, the auxiliary wire-discharge ion plasma electron emitter may include a substantially triangular-shaped wire electrode and/or a substantially triangular-shaped cathode.

In one non-limiting embodiment, the ion plasma electron emitters or the auxiliary ion plasma electron emitters may comprise an anode (or cation producing electrode) other than a wire-like anode. In such an embodiment, the anode may be an electrically conductive thin plate, sheet, or foil configured to allow the focused electron field emitted from the cathode to readily pass therethrough. In other embodiments, the anode may comprise any other suitable configuration. The electrically conductive thin plate, sheet, or foil anode may comprise any suitable shape such as substantially circular-shaped, square-shaped, rectangular-shaped, triangular-shaped, elliptical-shaped, ovate-shaped, or any other suitable shape. By providing an anode in these various shapes, or other various shapes, the shapes of the cross-sectional areas or profiles of the wide-area electron field and/or the focused electron field may be controlled. For example, to create a focused electron field having a circular cross-sectional shape, a circular thin plate, sheet, or foil anode may be used. In one non-limiting embodiment, the cathode of the ion plasma electron emitter or the auxiliary ion plasma electron emitter may also be comprised of any electrically conductive thin plate, sheet, or foil of any suitable dimensions. This electrically conductive thin plate, sheet, or foil of the cathode may comprise a similar shape as the shapes of the various anodes discussed above. In one non-limiting embodiment, the shape of the cathode may work in conjunction with the shape of the anode to produce a wide-area electron field or a focused electron field having variously shaped cross-sectional areas or profiles. Although the ion plasma electron emitters producing the wide-area electron fields are discussed above with reference to an exemplary wire-discharge ion plasma electron emitter, those of skill in the art will recognize that ion plasma electron emitters having 'non-wire' or 'non-straight wire' anodes may be used and are within the scope of the present disclosure.

Similar to the various wire-discharge ion plasma electron emitters described above, various non-limiting embodiments of the auxiliary wire-discharge ion plasma electron emitters may include one or more elongate wire anodes configured to produce a cation-containing plasma, wherein the plasma cations are impinged on a cathode to generate a field of secondary electrons (i.e., the focused electron field) that are accelerated to impinge on a target, such as condensate, for example, that is to be melted to reduce solid inclusions within the melt. The elongate wire anode may have a length dimension that is substantially greater than its thickness dimension. Although described as "elongate", the elongate wire anode can be formed into any suitable shape. The auxiliary wire-discharge ion plasma electron emitter may be constructed in a way that is substantially the same or generally similar to that described above with reference to the various wire-discharge ion plasma electron emitters. As such, the above description of the various wire-discharge ion plasma electron emitters is incorporated into the present description of the design of the auxiliary wire-discharge ion plasma electron emitter. In addition, a description of the manner of construction and operation of certain non-limiting embodiments of the auxiliary ion plasma electron emitter according to the present disclosure follows.

As noted above, an auxiliary ion plasma electron emitter according to the present disclosure may be configured to produce a focused electron field having any suitable cross-sectional profile or shape such as, for example, a substantially circular, square, rectangular, triangular, ovate, or elliptical shaped cross-sectional profile, or another cross-sectional profile of any other suitable bounded shape. In certain non-limiting embodiments, an auxiliary ion plasma electron emitter, such as an auxiliary wire-discharge ion plasma electron emitter according to the present disclosure may generate a field of electrons having a substantially rectangular-shaped cross-sectional profile (see FIGS. 13 and 14) or a substantially circular-shaped cross-sectional profile (see FIG. 15). Referring to FIG. 13, an auxiliary ion plasma electron emitter 802 may include an ionization or a plasma region, similar to plasma region 314 of FIG. 4, that includes a wire anode or an electrically conductive thin plate, sheet, or foil anode 819 (together 819) configured to produce a cation-containing plasma, and a cathode region, similar to cathode region 316 of FIG. 4, that includes a cathode 818. The cathode 818 may have any suitable shape. The plasma region may be filled with an ionizable gas at low pressure, and the gas may be ionized in the plasma region to produce the cation-containing plasma. For example, the plasma region may be filled with helium gas at, for example, approximately 20 mTorr. A small diameter wire anode or an electrically conductive thin plate, sheet, or foil anode 819 may be situated within the plasma region. This anode 819 may have any suitable shape, although a rectangular configuration is shown in FIG. 13. A positive voltage may be applied to the anode 819 by a high voltage power supply 822, initiating ionization of the helium gas into a plasma comprising helium cations and free "primary" electrons. Once ionization of the helium gas is initiated, the plasma is sustained by applying a voltage to the anode 819. Positively charged helium ions within the plasma are extracted from the plasma region through an extraction grid, similar to extraction grid 326 of FIG. 4, maintained at a high negative electrical potential, and accelerated through a high voltage gap, similar to high voltage gap 328 of FIG. 4, into the cathode region, where the cations in the plasma impact the cathode 818 maintained at a high negative voltage. The cathode 818 may be, for example, a coated or uncoated metal or alloy. In one non-limiting embodiment, the cathode 818 may comprise an insert having a high melting temperature and a low work function. A high voltage power supply, such as the high voltage power supply 522 of FIG. 6, imparts a negative voltage greater than 20,000 volts, for example, on the cathode 818.

Impingement of helium cations onto the cathode 818 releases secondary electrons from the cathode 818, thereby forming the focused electron field. The high voltage gap accelerates the secondary electrons in a direction opposite the direction of movement of the helium cations, through the extraction grid and into the plasma region (through the electrically conductive plate, sheet or foil, if present), and then through a thin metallic foil window, if present, similar to the thin metallic foil window 329 of FIG. 4, made of material relatively transparent to electrons. As noted above, depending on the relative gas pressures within the auxiliary electron emitter and the melting furnace chamber, it may be possible to omit the electron-transmissive window, in which case the electrons produced by the auxiliary electron emitter would enter the melting furnace vacuum chamber directly.

Still referring to FIG. 13, in one non-limiting embodiment positive ions from the anode 819 may be accelerated to impinge on the cathode 818 to create a focused electron field having a cross-sectional profile that is rectangular-shaped or substantially rectangular-shaped. The rectangular-shaped or substantially rectangular-shaped anode 819 and the cathode 818 may be designed and arranged to better promote transmission of the positively charged helium ions to the cathode 818. Also, the cathode 818 and the extraction grid may be designed and arranged to maximize secondary electron transmission through the extraction grid and with a field profile suitable for penetration through the electron-transmissive window, if present (and the electrically conductive thin plate, sheet or foil anode, if present). The focused field of energetic electrons exiting the auxiliary electron emitter 802 may be directed to impinge on a target within the vacuum chamber of a melting furnace. Also, the electron-transmissive window, if present, may be sized to be as thin as possible in order to maximize electron transmission from the auxiliary ion plasma electron emitter 802. An aluminum-type or titanium-type foil having a thickness allowing sufficient electron transmission, while also maintaining a soft vacuum environment within the auxiliary ion plasma electron emitter 802, may be used as the foil window, if necessary. Other suitably strong and acceptable electron transparent materials that may be used as a window in the apparatus, if present, will be known to those having ordinary skill in the art. As discussed generally herein, the window may be omitted if the pressure difference between the interior of the auxiliary electron emitter 802 and the vacuum chamber containing the target is not significant.

In one embodiment, referring to FIG. 14, an auxiliary ion plasma electron emitter 902 may include certain features similar to those of the auxiliary ion plasma electron emitter 802. The auxiliary electron emitter 902, however, includes a rectangular-shaped or substantially rectangular-shaped wire anode or electrically conductive thin plate, sheet, or foil anode (together 919) positioned within a plasma region, and a rectangular-shaped or substantially rectangular-shaped cathode 918 within a cathode region. Positive ions from the anode 919 may be accelerated toward the cathode 918 to create a focused electron field having a cross-sectional profile that is rectangular-shaped or substantially rectangular-shaped and is configured for impingement on any condensate, solidified portions, or unmelted portions of material within the melt, and/or onto regions of a forming or solidifying ingot. The auxiliary electron emitter 902 may also comprise a power supply configured to supply a positive voltage to the anode 919. Although not illustrated, it will be understood that the cathode 918 will be connected to a power supply configured to charge the cathode 918 to a high negative voltage.

In one embodiment illustrated in FIG. 15, an auxiliary electron emitter 1002 according to the present disclosure may include certain features similar to those of the auxiliary electron emitters 802 and 902. The auxiliary electron emitter 1002, however, includes a circular-shaped, or substantially circular-shaped, wire anode or an electrically conductive thin plate, sheet, or foil anode (together 1019) positioned within a plasma region and a circular-shaped, or substantially circular-shaped, cathode 1018 positioned within a cathode region. Positive ions from the anode 1019 may be accelerated toward the cathode 1018 to create a focused electron field having a cross-sectional profile that is circular-shaped or substantially circular-shaped and configured for impingement on any condensate, solidified portions or unmelted portions within the melt, and/or onto regions of a forming or solidifying ingot. The auxiliary electron emitter 1002 may also comprise a power supply configured to supply a positive voltage to the anode 1019. Although not illustrated, it will be understood that the cathode 1018 will be connected to a power supply configured to charge the cathode 1018 to a high negative voltage.

The power of the various auxiliary electron emitters according to the present disclosure is dependent on the density of the cations produced by the anode and the negative voltage of the cathode. The number of ions created during ionization is dependent on the voltage applied to the anode (i.e., a higher voltage generates a greater number of ions per unit time and increases the density of a produced electron field), and the energy of the electrons within the focused electron field is dependent on the negative voltage of the cathode. While not intending to be bound by any particular theory, the inventor believes that melting condensate within the vacuum chamber will be facilitated by utilizing a focused electron field having relatively high power (e.g., electron density and electron energy) because there may be limited residence time available in a particular region of the vacuum chamber for any condensate to be melted before the condensate is flowed within the melt into another region of the vacuum chamber. The same or a similar theory applies to melting solidified or unmelted portions within the melt.

In one non-limiting embodiment, an apparatus for melting an electrically conductive metallic material comprises a vacuum chamber, a hearth disposed in the vacuum chamber, and a melting device configured to melt the electrically conductive metallic material. The apparatus may also comprise at least one of a mold, a casting apparatus, and an atomizing apparatus in communication with the vacuum chamber and positioned to receive molten, electrically conductive metallic material from the hearth. The apparatus may comprise an auxiliary ion plasma electron emitter disposed in or adjacent to the vacuum chamber and positioned to direct a focused electron field having a cross-sectional area into the vacuum chamber. The focused field of electrons may have sufficient energy to at least one of melt or re-melt portions of the electrically conductive metallic material, melt solid condensate within the electrically conductive metallic material, and heat regions of a solidifying ingot when directed toward the electrically conductive material, the solid condensate, and the regions of a solidifying ingot using a steering device or system. In one non-limiting embodiment, the melting device comprises at least one ion plasma electron emitter disposed in or adjacent the vacuum chamber and positioned to direct a wide area electron field into the vacuum chamber. The wide-area electron field may have sufficient energy to heat the electrically conductive metallic material to its melting temperature. In another non-limiting embodiment, the melting device may comprise at least one thermo-ionic electron beam gun configured to emit an electron beam having sufficient energy to heat the electrically conductive metallic material to its melting temperature.

In one non-limiting embodiment, the auxiliary ion plasma electron emitters may be used with a melting furnace including one or more thermo-ionic electron beam guns. In view of the fact that a melting furnace using thermo-ionic electron beam guns generally has a vacuum chamber having a pressure much lower (e.g., $10^3$ to 7.5μ ($10^3$ to 1 Pa) to 15μ (2 Pa)) than a pressure of a melting furnace using ion plasma electron emitters (e.g., pressures greater than 40μ (5.3 Pa)), or pressures greater than 300μ (40 Pa)), an electron transmissive foil, such as the electron transmissive foil 705 of FIG. 10, for example, may be positioned between the auxiliary electron emitter 700' and the vacuum chamber 214 to maintain the separate pressures in the vacuum chamber 214 and the auxiliary electron emitter 700', for example. As such, the various auxiliary electron emitters may be used with a melting furnace incorporating one or more thermo-ionic electron beam guns and/or other suitable melting devices regardless of the operating pressure of the melting furnace. In various embodiments, any suitable number of auxiliary ion plasma electron emitters can be used in one melting furnace.

In one non-limiting embodiment, a method of generating an electron field to melt an electrically conductive material within a melting furnace is provided. The method may comprise providing an anode having a first non-linear shape, applying a voltage to the anode, and producing a plasma containing positive cations at the anode. The term "non-linear shape" can mean a shape other than a straight line or a substantially straight line. The term "non-linear shape" can also mean having a shape other than the shape of the various electrodes discussed above, such as the elongate wire electrode 516, for example. The method may further comprise providing a cathode having a second shape, positioning the cathode relative to the anode, and applying a voltage to the cathode. The voltage may be configured to negatively charge the cathode. The method may further comprise accelerating the positive cations toward the cathode to generate free secondary electrons, and forming the electron field using the free secondary electrons. The electron field may have a cross-sectional profile with a third shape. The third shape of the electron field may correspond to the first non-linear shape of the anode and/or the second shape of the cathode. In one embodiment, the third shape of the electron field may be substantially the same as the first non-linear shape of the anode and/or the second shape of the cathode. In various embodiments, the anode may comprise an electrically conductive elongate wire anode, an electrically conductive thin plate anode, an electrically conductive thin sheet anode, or an electrically conductive thin foil anode.

In one non-limiting embodiment, a method of processing a material may comprise introducing a material comprising at least one of a metal and a metallic alloy into a furnace chamber maintained at a low pressure relative to atmospheric pressure and generating a first electron field having a first cross-sectional area using a first ion plasma electron emitter. The material within the furnace chamber may then be subjected to the first electron field to heat the material to a temperature above a melting temperature of the material. The method may also comprise generating a second electron field having a second cross-sectional area using a second ion plasma electron emitter. At least one of solid condensate within the material, solidified portions of the material, and regions of a solidifying ingot may be subjected to the second electron field, using a steering device, to melt or heat the particular target. Also, the first cross-sectional area of the first electron field may be larger or otherwise different than the second cross-sectional area of the second electron field. The pressure within the first ion plasma electron emitter and the second ion plasma electron emitter may be maintained at the same or substantially the same pressure as exists within the furnace chamber. In other non-limiting embodiments, the pressure within the furnace chamber may be maintained at a pressure less than a pressure within the first ion plasma electron emitter and the second ion plasma electron emitter, for example.

In another non-limiting embodiment, a method of processing a material may comprise introducing a material comprising at least one of a metal and a metallic alloy into a furnace chamber maintained at a low pressure relative to atmospheric pressure and subjecting the material within the furnace chamber to a melting device configured to heat the material to a temperature above a melting temperature of the material. The method may also comprise generating a focused electron field using an auxiliary ion plasma electron emitter and subjecting at least one of any condensate within the material, any solidified portions of the material, and regions of a forming or solidifying ingot to the focused electron field, using a steering device, to melt or heat at least one of the condensate, the solidified portions, and the regions of the forming or solidifying ingot. In various non-limiting embodiments, the melting device may comprise at least one thermo-ionic electron beam gun or at least one ion plasma electron emitter.

In still other non-limiting embodiments, a method of processing a material may comprise generating a focused electron field including a cross-sectional profile having a first shape using an auxiliary ion plasma electron emitter and steering the focused electron field to impinge the focused electron field on the material and melt or heat at least one of any solid condensate within the material, any solidified portions of the material, and/or regions of a forming or solidifying ingot. The method may also comprise generating the focused electron field using an electrode having a second shape and a cathode having a third shape, wherein the first shape is substantially similar to the second shape and/or the third shape. In one non-limiting embodiment, the generated focused electron field emitted from the auxiliary ion plasma electron emitter may have one of a substantially circular-shaped cross-sectional profile and a substantially rectangular-shaped cross-sectional profile. Such focused electron fields may be generated using a substantially circular-shaped electrode or anode and a substantially circular-shaped cathode or a substantially rectangular-shaped electrode or anode and substantially rectangular-shaped cathode, for example.

Although the foregoing description has necessarily presented only a limited number of embodiments, those of ordinary skill in the relevant art will appreciate that various changes in the apparatus and methods and other details of the examples that have been described and illustrated herein may be made by those skilled in the art, and all such modifications will remain within the principle and scope of the present disclosure as expressed herein and in the appended claims. For example, although the present disclosure has necessarily only presented a limited number of embodiments of electron beam melting furnaces according to the present disclosure, and also has necessarily only discussed a limited number of ion plasma electron emitter and auxiliary ion plasma electron emitter designs, it will be understood that the present disclosure and associated claims are not so limited. Those having ordinary skill, upon considering the present disclosure, will readily identify additional ion plasma electron emitter and auxiliary ion plasma electron emitter designs and may comprehend additional furnace designs along the lines and within the spirit of the necessarily limited number of embodiments discussed herein. It is understood, therefore, that the present invention is not limited to the particular embodiments disclosed or incorporated herein, but is intended to cover modifications that are within the principle and scope of the invention, as defined by the claims. It will also be appreciated by those skilled in the art that changes could be made to the embodiments above without departing from the broad inventive concept thereof.

What is claimed is:

1. An apparatus for melting an electrically conductive metallic material, the apparatus comprising:
    a vacuum chamber;
    a hearth disposed in the vacuum chamber;
    at least one ion plasma electron emitter disposed in or adjacent the vacuum chamber, the at least one ion plasma electron emitter being configured to produce a first field of electrons having a first area of coverage and sufficient energy to heat the electrically conductive metallic material to its melting temperature, wherein the electrically conductive metallic material is at least one material selected from titanium, a titanium alloy, tungsten, niobium, tantalum, platinum, palladium, zirconium, iridium, nickel, a nickel base alloy, iron, an iron base alloy, cobalt, and a cobalt base alloy, and wherein the at least one ion plasma electron emitter is positioned to direct the first field of electrons into the vacuum chamber;
    at least one of a mold and an atomizing apparatus positioned to receive the electrically conductive metallic material from the hearth; and
    an auxiliary ion plasma electron emitter disposed in or adjacent the vacuum chamber, the auxiliary ion plasma electron emitter being configured to produce a second field of electrons having a second area of coverage and sufficient energy to at least one of heat at least a portion of the electrically conductive metallic material to at least its melting temperature, melt solid condensate within the electrically conductive metallic material, and provide heat to regions of a forming ingot, the auxiliary ion plasma electron emitter being configured to focus the second field of electrons such that the second area of coverage is smaller than the first area of coverage; and a steering device configured for steering the second field of electrons emitted by the auxiliary ion plasma electron emitter to direct the focused second field of electrons toward at least one of the at least a portion of the electrically conductive metallic material, the solid condensate, and the forming ingot, and wherein the steering device is configured to selectively steer the second field of electrons produced by the auxiliary ion plasma electron emitter within at least a region of the first area of coverage.

2. The apparatus of claim 1, wherein the at least one ion plasma electron emitter opens into the vacuum chamber so that the first field of electrons may pass directly from the at least one ion plasma electron emitter into the vacuum chamber without passing through an electron transmissive window.

3. The apparatus of claim 1, wherein the apparatus is an electron beam cold hearth melting furnace.

4. The apparatus of claim 1, wherein the first area of coverage of the first field of electrons is a wide-area electron field.

5. The apparatus of claim 1, wherein a cross-section of the second field of electrons comprises one of a substantially circular-shaped cross-sectional profile and a substantially rectangular-shaped cross-sectional profile.

6. The apparatus of claim 1, wherein the second field of electrons is configured to be rastered to allow for at least one of the heating portions of the electrically conductive metallic material to at least its melting temperature, melting solid condensate within the electrically conductive metallic material, and providing heat to regions of a forming ingot.

7. The apparatus of claim 1, wherein the auxiliary ion plasma electron emitter opens into the vacuum chamber so that the second field of electrons may pass directly from the auxiliary ion plasma electron emitter into the vacuum chamber without passing through an electron transmissive window.

8. The apparatus of claim 1, wherein the hearth includes a molten material holding region, and wherein the hearth and the at least one ion plasma electron emitter are disposed so that the first field of electrons emitted by the at least one ion plasma electron emitter at least partially impinges on the molten material holding region.

9. The apparatus of claim 1, further comprising at least one feeder configured to introduce the electrically conductive metallic material into the vacuum chamber in a position over at least a region of the hearth.

10. The apparatus of claim 9, wherein the feeder and the at least one ion plasma electron emitter are disposed so that the first field of electrons emitted by the at least one ion plasma electron emitter at least partially impinges on the electrically conductive metallic material introduced into the vacuum chamber by the feeder.

11. The apparatus of claim 1, wherein the at least one ion plasma electron emitter comprises a plasma region including an electrode configured to produce a positive ion plasma.

12. The apparatus of claim 11, wherein the electrode comprises a wire positioned along a portion of the plasma region.

13. The apparatus of claim 11, wherein the at least one ion plasma electron emitter further comprises a cathode region including a cathode electrically connected to a high voltage power supply configured to negatively charge the cathode, the cathode positioned relative to the electrode so that positive ions generated by the electrode are accelerated toward and impinge on the cathode, liberating the first field of electrons from the cathode.

14. The apparatus of claim 13, wherein the at least one ion plasma electron emitter further comprises an electron transmissive foil window, the foil window positioned within a wall of the vacuum chamber thereby allowing the first field of electrons liberated from the cathode to enter the vacuum chamber through the foil window.

15. The apparatus of claim 13, wherein the high voltage power supply is configured to power the cathode to a negative voltage greater than 20,000 volts.

16. The apparatus of claim 1, wherein the auxiliary ion plasma electron emitter comprises a plasma region including an electrode configured to produce a positive ion plasma.

17. The apparatus of claim 16, wherein the electrode comprises a wire positioned within the plasma region proximate to an end of the vacuum chamber opposite from a feeder configured to introduce the electrically conductive metallic material into the vacuum chamber in a position over at least a region of the hearth.

18. The apparatus of claim 16, wherein the auxiliary ion plasma electron emitter further comprises a cathode region including a cathode electrically connected to a high voltage power supply configured to negatively charge the cathode, the cathode positioned relative to the electrode so that positive ions generated by the electrode are accelerated toward and impinge on the cathode, liberating the second field of electrons from the cathode.

19. The apparatus of claim 18, wherein the high voltage power supply is configured to power the cathode to a negative voltage greater than 20,000 volts.

20. The apparatus of claim 18, wherein at least one of the electrode and the cathode is substantially circular-shaped to create a substantially circular-shaped cross-sectional profile for the second field of electrons.

21. The apparatus of claim 18, wherein at least one of the electrode and the cathode is substantially rectangular-shaped to create a substantially rectangular-shaped cross-sectional profile for the second field of electrons.

22. The apparatus of claim 18, wherein the auxiliary ion plasma electron emitter further comprises an electron transmissive foil window, the foil window positioned within a wall of the vacuum chamber thereby allowing the second field of electrons liberated from the cathode to enter the vacuum chamber through the foil window.

23. An apparatus for melting an electrically conductive metallic material, the apparatus comprising:
a vacuum chamber;
a hearth disposed in the vacuum chamber;
a melting device configured to melt the electrically conductive metallic material, wherein the melting device comprises at least one ion plasma electron emitter disposed in or adjacent the vacuum chamber and positioned to direct a wide-area electron field into the vacuum chamber, the wide-area electron field comprising an area of coverage and having sufficient energy to heat the electrically conductive metallic material to its melting temperature;
at least one of a mold and an atomizing apparatus positioned to receive molten electrically conductive metallic material from the hearth; and
an auxiliary ion plasma electron emitter disposed in or adjacent to the vacuum chamber, the auxiliary ion plasma electron emitter being configured to produce a focused electron field having an area of coverage smaller than the area of coverage of the wide-area electron field and sufficient energy to at least one of melt at least a portion of the electrically conductive metallic material, melt solid condensate within the electrically conductive metallic material, and heat regions of a solidifying ingot, wherein the auxiliary ion plasma electron emitter includes a steering systems configured to steer the focused electron field toward at least one of the at least a portion of the electrically conductive metallic material, the solid condensate, and the solidifying ingot.

24. The apparatus of claim 23, wherein the melting device further comprises at least one thermo-ionic electron beam gun configured to emit an electron beam having sufficient energy to heat the electrically conductive metallic material to its melting temperature.

25. An apparatus for melting an electrically conductive metallic material, the apparatus comprising:
at least one ion plasma electron emitter disposed in or adjacent the vacuum chamber and positioned to direct a wide-area electron field into the vacuum chamber, the wide-area electron field comprising an area of coverage and having sufficient energy to heat the electrically conductive metallic material to its melting temperature;
an auxiliary ion plasma electron emitter configured to produce a focused electron field having an area of coverage smaller than the area of coverage of the wide-area electron field, wherein a cross-sectional area of the focused electron field defines a cross-sectional profile having a first shape; and
a steering system configured to selectively steer the focused electron field within at least a region of the area of coverage of the wide-area electron field to impinge the focused electron field on at least a portion of the electrically conductive metallic material to at least one of melt any solidified portions of the electrically conductive metallic material, melt any solid condensate within the electrically conductive metallic material, and provide heat to regions of a forming ingot.

26. The apparatus of claim 25, further comprising an electrode having a second shape and a cathode having a third shape, wherein the first shape is substantially similar to at least one of the second shape and the third shape.

27. The apparatus of claim 25, wherein the first shape is one of substantially circular-shaped and substantially rectangular-shaped.

28. The apparatus of claim 27, wherein the auxiliary ion plasma electron emitter comprises a substantially circular-shaped electrode and a substantially circular-shaped cathode configured to produce the focused electron field having the substantially circular-shaped cross-sectional profile.

29. The apparatus of claim 27, wherein the auxiliary ion plasma electron emitter comprises a substantially rectangular-shaped wire electrode and a substantially rectangular-shaped cathode configured to produce the focused electron field having the substantially rectangular-shaped cross-sectional profile.

* * * * *